(12) United States Patent
Jeon et al.

(10) Patent No.: US 12,207,408 B2
(45) Date of Patent: Jan. 21, 2025

(54) FLEXIBLE CIRCUIT BOARD AND DISPLAY DEVICE INCLUDING THE SAME

(71) Applicant: Samsung Display Co., Ltd., Yongin-Si (KR)

(72) Inventors: Hyun Jee Jeon, Hanam-si (KR); Ga Young Kim, Hwaseong-si (KR); Young Min Park, Gwangmyeong-si (KR); Sang Hyun Lim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 515 days.

(21) Appl. No.: 17/499,924

(22) Filed: Oct. 13, 2021

(65) Prior Publication Data
US 2022/0342461 A1 Oct. 27, 2022

(30) Foreign Application Priority Data
Apr. 27, 2021 (KR) .................. 10-2021-0054011

(51) Int. Cl.
| | |
|---|---|
| *G06F 1/18* | (2006.01) |
| *H05K 1/14* | (2006.01) |
| *H05K 1/18* | (2006.01) |
| *H02J 50/10* | (2016.01) |

(52) U.S. Cl.
CPC ............. *H05K 1/147* (2013.01); *H05K 1/189* (2013.01); *H02J 50/10* (2016.02); *H02J 2310/22* (2020.01); *H05K 2201/055* (2013.01); *H05K 2201/10128* (2013.01)

(58) Field of Classification Search
CPC .. H05K 1/147; H05K 1/189; H05K 2201/055; H02J 50/10; H02J 2310/22; G06F 1/18
USPC ........................................................ 361/749
See application file for complete search history.

(56) References Cited

U.S. PATENT DOCUMENTS 9,678,604 B2  6/2017  Lee
2020/0168157 A1* 5/2020 Kim ..................... H10K 59/131

\* cited by examiner

*Primary Examiner* — Tremesha W Burns
(74) *Attorney, Agent, or Firm* — Innovation Counsel LLP

(57) ABSTRACT

A display device is provided. The display device comprises a display panel comprising an active area for displaying images on a front surface and a non-active area around the active area, and a flexible circuit board comprising at least one conductive line extending from one end to an opposite end, wherein the flexible circuit board is disposed on a rear surface of the display panel to have a loop shape surrounding more than half of at least a part of the active area.

14 Claims, 24 Drawing Sheets

FLEXIBLE CIRCUIT BOARD AND DISPLAY DEVICE INCLUDING THE SAME

This application claims priority to Korean Patent Application No. 10-2021-0054011 filed on Apr. 27, 2021, in the Korean Intellectual Property Office, the disclosure of which is incorporated herein by reference in its entirety.

BACKGROUND

1. Field of the Disclosure

The disclosure relates to a flexible circuit board and a display device including the same.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

Since a display device is driven using electric energy, it may include a battery for supplying electric energy or may receive electric energy continuously from an external source.

Using such electrical energy, the display device may provide a wireless charging function for charging an external electronic device such as an electronic pen, a wireless earphone, and a smart watch.

SUMMARY

Aspects of the disclosure provide a display device in which a large wireless charging area can be implemented by using a small flexible circuit board.

Aspects of the disclosure also provide a flexible circuit board providing a large wireless charging area by using a relatively small flexible circuit board.

This and other aspects, embodiments and advantages of the disclosure will become immediately apparent to those of ordinary skill in the art upon review of the Detailed Description and Claims to follow.

According to the embodiments of the disclosure, a flexible circuit board and a display device including the same can increase the area for wireless charging and reduce unnecessary cost, and can reduce weight and thickness of the display device.

It should be noted that effects of the disclosure are not limited to those described above and other effects of the disclosure will be apparent to those skilled in the art from the following descriptions.

According to an embodiment of the disclosure, a display device comprises a display panel comprising an active area for displaying images on a front surface and a non-active area around the active area and a flexible circuit board comprising at least one conductive line extending from one end to an opposite end, wherein the flexible circuit board is disposed on a rear surface of the display panel to have a loop shape surrounding more than half of at least a part of the active area.

A main circuit board disposed in the non-active area of the display panel, wherein the one end and the opposite end of the flexible circuit board are disposed on the main circuit board such that they are spaced apart from each other.

The main circuit board comprises at least one connection line, and the at least one conductive line of the flexible circuit board is electrically connected to the at least one connection line of the main circuit board.

The at least one conductive line comprises a plurality of conductive lines and the at least one connection line comprises a plurality of connection lines, and a single current path is formed by the plurality of conductive lines and the plurality of connection lines.

The flexible circuit board overlaps the non-active area.

The flexible circuit board does not overlap the active area.

The display device may further comprise a main circuit board disposed in the non-active area of the display panel, wherein the flexible circuit board comprises a first section closer to the one end and a second section closer to the opposite end, and the one end of the flexible circuit board is disposed on the main circuit board, and the opposite end of the flexible circuit board is connected to the second section of the flexible circuit board.

The flexible circuit board completely surrounds at least a part of the active area.

The flexible circuit board may further comprise a first area extending in a first direction, a second area extending in a second direction crossing the first direction, and a first corner area located between the first area and the second area to connect them, and wherein at least two surfaces of the flexible circuit board overlap each other in the first corner area.

The flexible circuit board is bent so that at least a part of one surface of the flexible circuit board faces another part of the one surface of the flexible circuit board in the first corner area.

The flexible circuit board may further comprise a third area extending in a direction opposite to the first direction, a second corner area disposed between the second area and the third area to connect the second area and the third area, a fourth area extending in a direction opposite to the second direction, a third corner area disposed between the third area and the fourth area to connect the third area and the fourth area, a fifth area extending in the direction opposite to the first direction, and a fourth corner area disposed between the fourth area and the fifth area to connect the fourth area and the fifth area, wherein a width of each of the first area, the third area and the fifth area of the flexible circuit board in the second direction is equal to a width of each of the second area and the fourth area in the first direction, and the flexible circuit board has a loop shape surrounding at least ¾ of the active area.

The flexible circuit board may further comprise a first subsidiary flexible circuit board and a second subsidiary flexible circuit board, and each of the first subsidiary flexible circuit board and the second subsidiary flexible circuit board has a loop shape surrounding at least one-fourth of the active area.

The first subsidiary flexible circuit board and the second subsidiary flexible circuit board do not overlap each other in a plan view.

The first subsidiary flexible circuit board and the second subsidiary flexible circuit board partially overlap each other in a plan view.

According to an embodiment of the disclosure, a flexible circuit board comprises at least one conductive line extending from one end to an opposite end, a first side extending in one direction, and a second side facing to the first side, a plurality of first sections having a first width between the first side and the second side, at least one second section having a second width between the first side and the second side that is smaller than the first width; and a plurality of transition sections in which the second side extends in a direction crossing an extension direction of the first side and disposed between the first sections and the second section.

The at least one conductive line may further comprise a plurality of conductive lines, wherein the plurality of the conductive lines are arranged at a first distance in the first sections and arranged at a second distance in the second section that is smaller than the first distance.

The flexible circuit board may further comprise a third section that is disposed between the plurality of first sections and having a width between the first side and the second side greater than the first width.

The plurality of conductive lines is arranged at the first distance in the third section.

The plurality of conductive lines extend in a direction inclined with respect to an extension direction of the first side in the transition sections.

The second section occupies 5% or less area of the flexible circuit board.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The present inventive concept will now be described more fully hereinafter with reference to the accompanying drawings, in which embodiments of the inventive concept are shown. This inventive concept may, however, be embodied in different forms and should not be construed as limited to the embodiments set forth herein. Rather, these embodiments are provided so that this disclosure will be thorough and complete, and will filly convey the scope of the inventive concept to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present inventive concept. Similarly, the second element could also be termed the first element.

Hereinafter, embodiments of the disclosure will be described with reference to the accompanying drawings.

Figure 1:
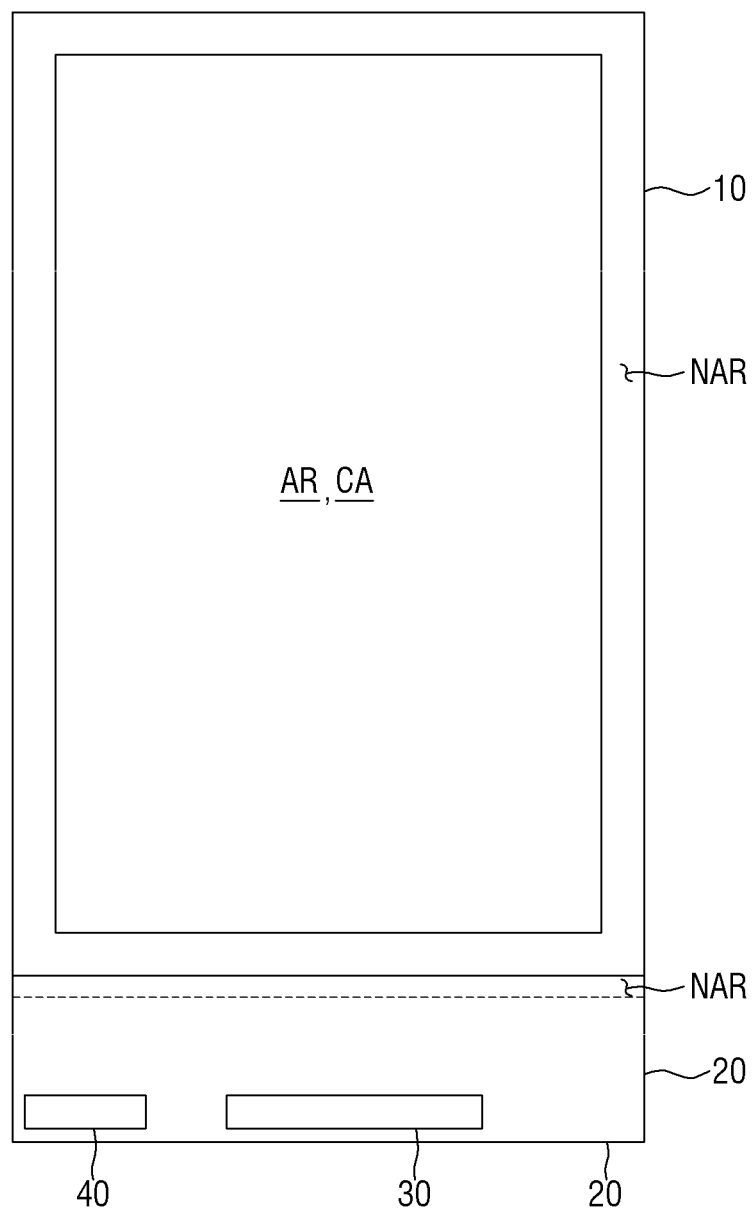
FIG. 1 is a plan view of a display device according to an embodiment of the disclosure.
Figure 1:
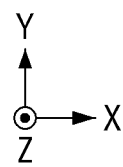
Figure 2:
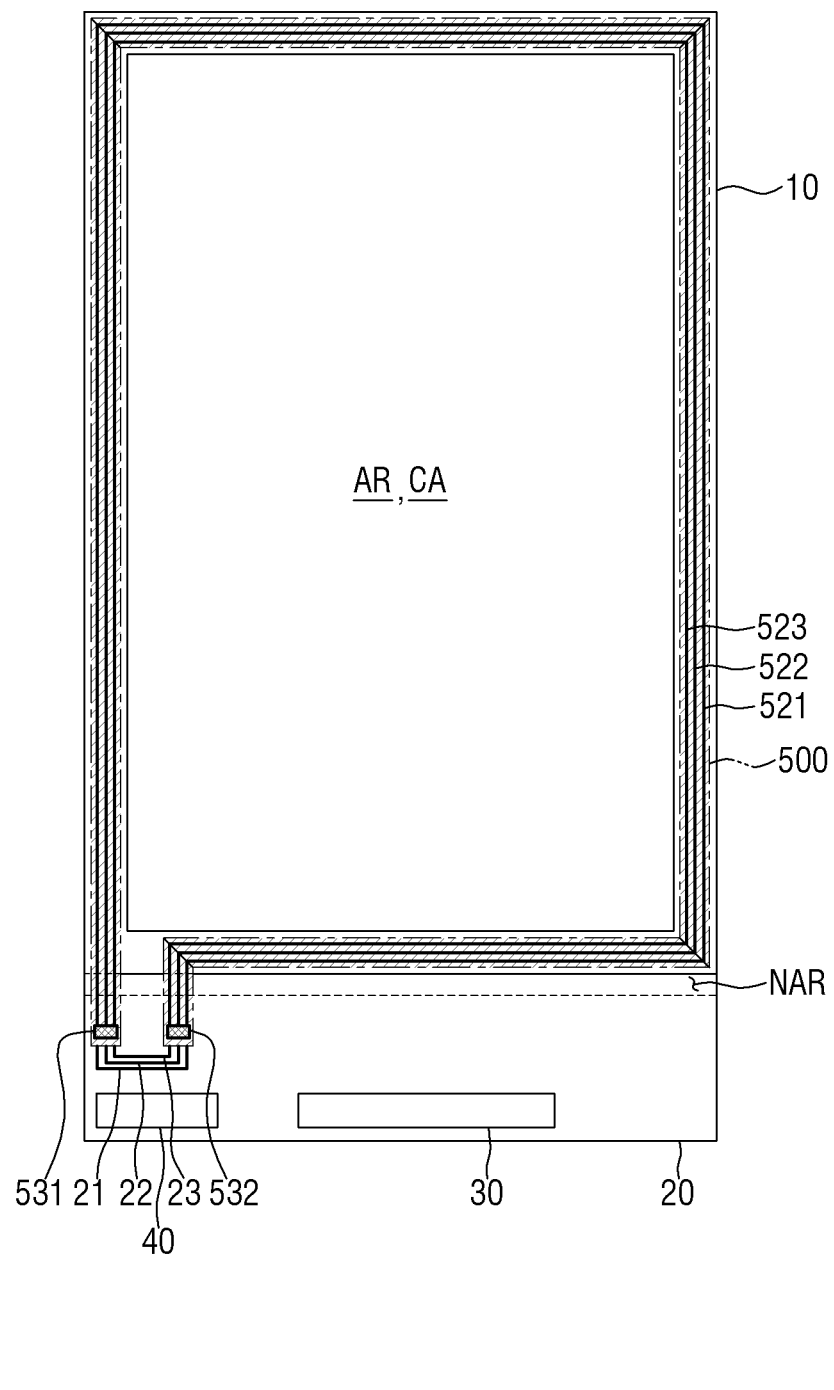
FIG. 2 is a plan view showing an arrangement structure of a display panel and a flexible circuit board according to an embodiment of the disclosure.
Figure 3:
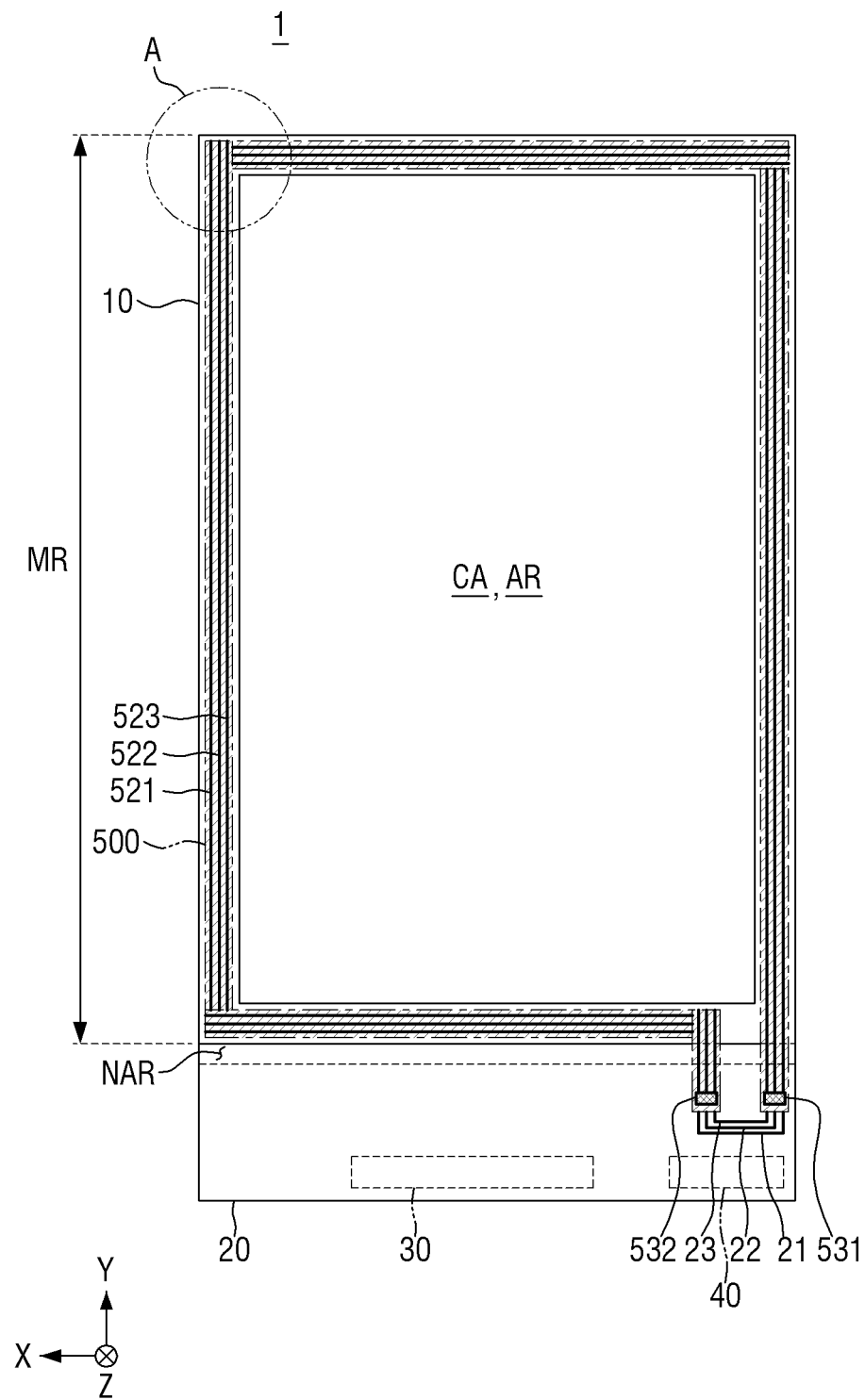
FIG. 3 is a plan view showing the display panel and the flexible circuit board according to the embodiment when viewed from another perspective.
Figure 4:
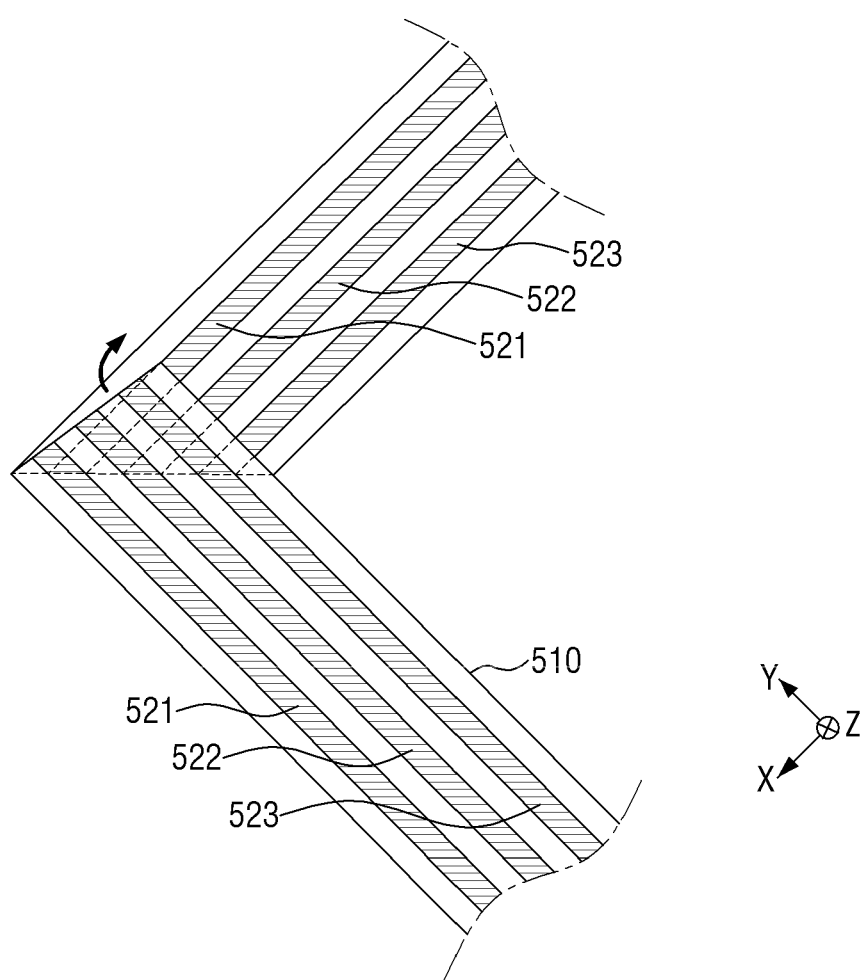
FIG. 4 is an enlarged view of area A of FIG. 3.
Figure 5:
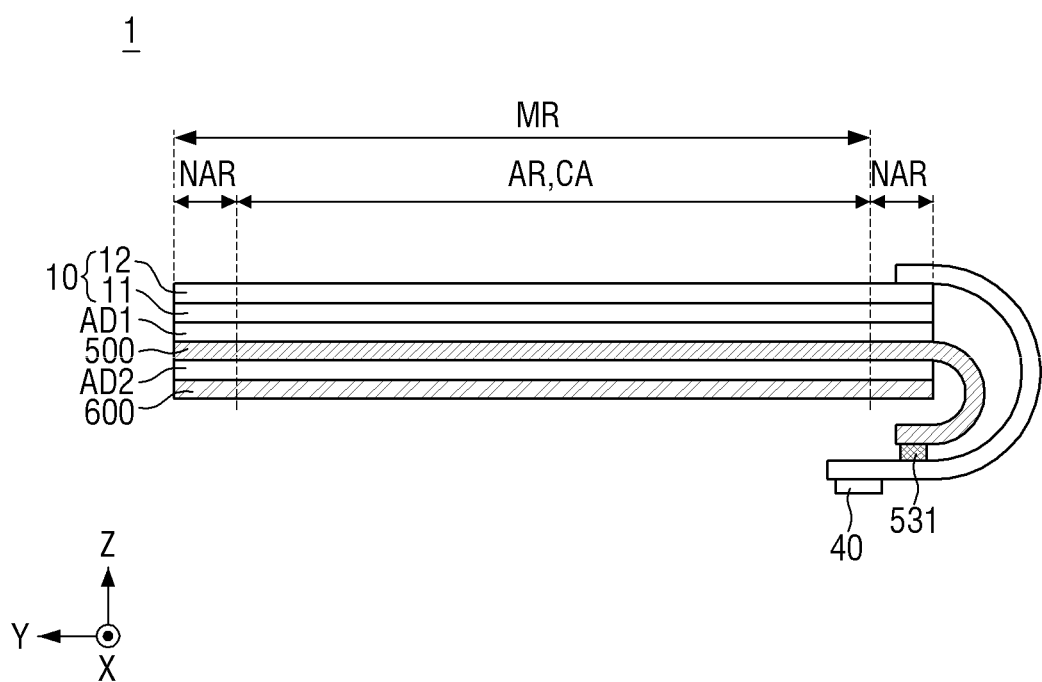
FIG. 5 is a cross-sectional view of a display device according to an embodiment of the disclosure when viewed in the first direction.
Figure 6:
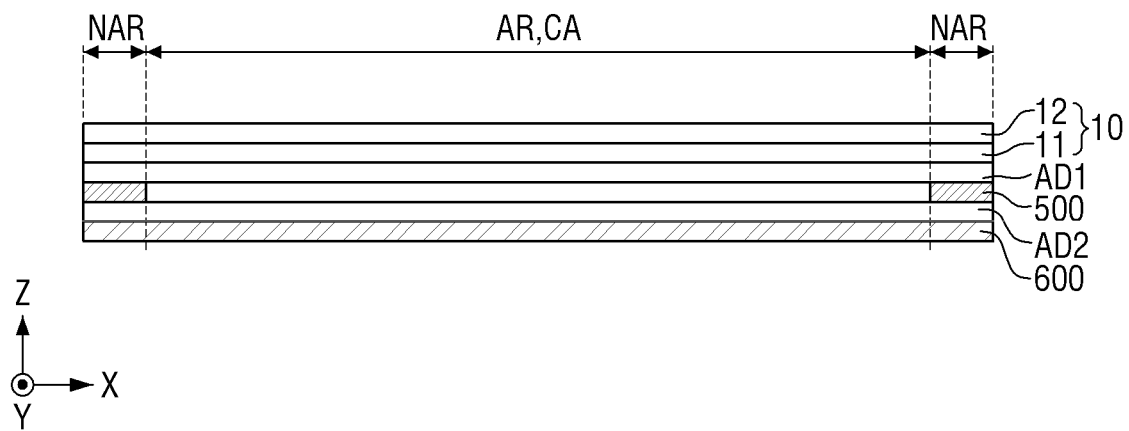
FIG. 6 is a cross-sectional view of the display device according to the embodiment of the disclosure when viewed in the second direction.

FIG. 1 is a plan view of a display device according to an embodiment of the disclosure. FIG. 2 is a plan view showing an arrangement structure of a display panel and a flexible circuit board according to an embodiment of the disclosure. FIG. 3 is a plan view showing the display panel and the flexible circuit board according to the embodiment when viewed from another perspective. FIG. 4 is an enlarged view of area A of FIG. 3. FIG. 5 is a cross-sectional view of a display device according to an embodiment of the disclosure when viewed in the first direction. FIG. 6 is a cross-sectional view of the display device according to the embodiment of the disclosure when viewed in the second direction.

In the following description, a first direction X, a second direction Y and a third direction Z are defined.

The first direction X may refer to a direction parallel to a side of the display device 1, for example, the horizontal direction of the display device 1 when viewed from the top. A second direction Y may refer to a direction parallel to another side of the display device 1 that meet the side of the display device 1, for example, the vertical direction of the display device 1 when viewed from the top. A third direction Z may refer to the thickness direction of the display device 1. In the following description, a first side in the first direction X indicates the right side, a second side in the first direction X indicates the left side, a first side in the second direction Y indicates the upper side, and a second side in the second direction Y indicates the lower side when viewed from the top, for convenience of illustration. In addition, a first side in the third direction Z indicates the upper side in the cross-sectional view, and a second side in the third direction Z indicates the lower side in the cross-sectional view. It should be understood that the directions referred to in the embodiments are relative directions, and the embodiments are not limited to the directions mentioned.

The display device 1 may include a variety of electronic devices that provide a display screen. Examples of the display device include, but are not limited to, a mobile phone, a smart phone, a tablet PC, a mobile communications terminal, an electronic organizer, an e-book, a personal digital assistant (PDA), a portable multimedia player (PMP), a navigation device, an ultra mobile PC (UMPC), a television set, a game machine, a wristwatch-type electronic device, a head-mounted display, a personal computer monitor, a laptop computer, a vehicle instrument cluster, a digital camera, a camcorder, an outdoor billboard, an electronic billboard, various medical apparatuses, various inspection devices, various home appliances including a display area such as a refrigerator and a laundry machine, Internet of things (IoT) devices, etc. Examples of the display devices to be described later include, but are not limited to, a smartphone, a tablet PC, a laptop computer, etc.

Referring to FIGS. 1 to 6, at least one of a front surface and a rear surface of the display device 1 may be a display surface. As used herein, the front surface refers to a surface (first surface) located on one side of a plane, i.e., a surface located on the first side in the third direction Z in the drawings. The rear surface refers to a surface (second surface; the opposite surface) located on the opposite side of the plane, i.e., a surface located on the second side in the third direction Z in the drawings.

According to an embodiment of the disclosure, the display surface may be located on the front surface of the display device 1, and no image may be displayed on the rear surface. In the following description, images are displayed only on the front surface of the display devices according to the embodiments of the disclosure. It is, however, to be understood that the display device 1 may be a double-sided display device in which images are displayed on both front and rear surfaces.

The display device 1 includes an active area AR and a non-active area NAR. In the display device 1, a display area may be defined as an area where images are displayed while a non-display area may be defined as an area where no image is displayed. In addition, a touch area may be defined as an area where a touch input is sensed. Then, the display area and the touch area may be included in the active area AR. A touch input may include a touch input by a part of a user's body (e.g., a finger) and a touch input by an electronic pen (e.g., a stylus pen).

The display area and the touch area may overlap each other. In other words, in the active area AR, images are displayed and a touch input is sensed as well. The shape of the active area AR may be a rectangle or a rectangle with rounded corners. In the example shown, the shape of the active area AR is a rectangle that has its sides in the second direction Y longer than its sides in the first direction X. It is, however, to be understood that the disclosure is not limited thereto. The active area AR may have various shapes such as a rectangular shape that has rounded corners and has its sides in the first direction X longer than its sides in the second direction Y, a square shape, other polygonal shapes, a circular shape, and an elliptical shape.

The non-active area NAR is disposed around the active area AR. The non-active area NAR may be a bezel area. The non-active area NAR may surround all sides (four sides in the drawings) of the active area AR. It is, however, to be understood that the disclosure is not limited thereto. For example, the non-active area NAR may be disposed only around three sides of the active area AR. In such case, the side of the active area AR in which no non-active area NAR is disposed around it may form an edge of the display device 1. In such case, a flexible circuit board 500 for providing a wireless charging function may be disposed in the active area AR forming the edge of the display device 1.

In the non-active area NAR, signal lines for applying signals to the active area AR (display area or touch area) or driving circuits may be disposed. In addition, conductive lines for providing a wireless charging function may be disposed in the non-active area NAR. The non-active area NAR may not include the display area or the touch area. The non-active area NAR may be completely identical to the non-display area where no image is displayed. In some other embodiments, a part of the touch area may also overlap the non-active area NAR.

The display device 1 may include a display panel 10 providing a display screen, a main circuit board 20 disposed in a non-active area NAR of the display panel 10, and a flexible circuit board 500 disposed on a rear surface of the display panel 10 to overlap the display panel 10 in a plan view.

Although the display panel 10 as well as the flexible circuit board 500 are seen from the front of the display device 1 in FIG. 2 in order to describe the arrangement relationship between the display panel 10 and the flexible circuit board 500 disposed on the rear surface of the display panel 10, the flexible circuit board 500 may be completely covered by the display panel 10 and actually may not be seen from the front of the display device 1.

Examples of the display panel 10 may include a self-luminous display panel such as an organic light-emitting display panel (OLED), an inorganic light-emitting display panel (inorganic EL), a quantum-dot light-emitting display panel (QED), a micro LED display panel (micro-LED), a nano LED display panel (nano-LED), a plasma display panel (PDP), a field emission display panel (FED) and a cathode ray display panel (CRT), as well as a light-receiving display panel such as a liquid-crystal display panel (LCD) and an electrophoretic display panel (EPD). In the following description, the organic light-emitting display panel will be described as an example of the display panel 10, and the organic light-emitting display panel will be simply referred to as the display panel 10 unless specifically stated otherwise. It is, however, to be understood that the embodiments of the disclosure are not limited to the organic light-emitting display panel, and any other display panel listed above or well known in the art may be employed without departing from the scope of the disclosure.

The display panel 10 may include a display layer 11 and a touch layer 12 disposed on the display layer 11.

The display layer 11 may include a plurality of pixels. Each of the pixels is a unit for displaying an image. The pixels may include, but are not limited to, a red pixel, a green pixel and a blue pixel. A plurality of pixels may be arranged sequentially and repeatedly when viewed from the top. For example, the pixels may be arranged in, but is not limited to, a matrix.

Each of the plurality of pixels may include light-emitting elements for displaying images, a plurality of thin-film transistors for driving the light-emitting elements, and signal lines for transmitting electrical signals to the plurality of thin-film transistors. It is, however, to be understood that the disclosure is not limited thereto. The plurality of pixels may display images by receiving electrical signals and voltages from a display driving circuit 30 disposed on the main circuit board 20.

The display layer 11 may include a display area and a non-display area. In the display area, a plurality of pixels may be disposed. In the non-display area, signal lines for applying electrical signals to the plurality of pixels may be disposed.

The touch layer 12 may sense a touch input and may perform the functions of a touch screen. A touch input may include a touch input by a part of a user's body (e.g., a finger) as well as a touch input by an electronic pen (e.g., a stylus pen).

The touch layer 12 may include a plurality of sensing electrodes and touch driving lines. The touch layer 12 may receive an electrical signal from the touch driving circuit 40 disposed on the main circuit board 20 through the touch driving lines, or may transmit an electrical signal sensed from the plurality of sensing electrodes to the touch driving circuit 40 through the touch driving lines, to detect a touch input.

The touch layer 12 may measure a change in mutual capacitance between adjacent ones of the plurality of sensing electrodes to detect a touch input. Since the touch layer 12 uses an electric field to detect a touch input, it is possible to separately detect the touch input without interference with the magnetic field generated by the flexible circuit board 500 or being interfered with the generated magnetic field.

The touch layer 12 may include a touch area and a non-touch area. In the touch area, a plurality of sensing electrodes may be disposed. In the non-touch area, touch driving lines may be disposed.

The display area and the touch area may overlap each other in the third direction Z. It should be noted that the plurality of sensing electrodes includes a planar pattern made of a transparent conductive layer or a mesh pattern made of an opaque metal along regions where the light-emitting elements are not disposed, and thus the sensing electrodes do not hinder the progress of light emitted from the display layer 11.

Although the touch member is integrated into the display panel 10 in the form of the touch layer 12 in the example of FIGS. 5 and 6, the disclosure is not limited thereto. For example, the touch member may be implemented as a panel or film separate from the display panel 10 and attached to the display panel 10.

The main circuit board 20 may be disposed in the non-active area NAR on the lower side of the display panel 10. The main circuit board 20 may be attached to the non-active area NAR on the lower side of the display panel 10 through a conductive adhesive member such as an anisotropic conductive film. The main circuit board 20 may be a flexible printed circuit board, a printed circuit board, or a flexible film such as a chip on film.

The main circuit board 20 may be bent with a curvature toward the lower side in the third direction Z of the display device 1, i.e., in the direction away from the display surface. The main circuit board 20 may be bent with a constant radius of curvature, but the disclosure is not limited thereto. The radius of curvature may vary across different regions of the main circuit board 20. Accordingly, a front surface of the main circuit board 20 may face an opposite direction of the display panel 10 through which an image is displayed.

The display driving circuit 30 and the touch driving circuit 40 may be disposed on the main circuit board 20.

The display driving circuit 30 may generate signals and voltages for driving the plurality of pixels of the display panel 10. The display driving circuit 30 may be implemented as an integrated circuit (IC) and may be attached to the main circuit board 20 by chip-on-film (COF) technique, but the disclosure is not limited thereto. It may be attached to the non-display area of the display panel 10 by a chip on glass (COG) technique, a chip on plastic (COP) technique, or an ultrasonic bonding.

The touch driving circuit 40 may apply electric signals to the plurality of sensing electrodes of the touch layer 12 or may sense electrical signals transmitted from the plurality of sensing electrodes. In addition, the touch driving circuit 40 may provide an electric current to the plurality of conductive lines 521, 522 and 523 of the flexible circuit board 500 for providing a wireless charging function to an external electronic device. The touch driving circuit 40 may be implemented as an integrated circuit and attached to the main circuit board 20 by the chip on film (COF) technique. It should be understood, however, that the disclosure is not limited thereto. The touch driving circuit 40 may be attached to the non-display area of the display panel 10 by chip-on-glass (COG) technique, chip-on-plastic (COP) technique, or ultrasonic bonding.

Although the display driving circuit 30 and the touch driving circuit 40 are implemented as separated integrated circuits, respectively, herein, the display driving circuit 30 and the touch driving circuit 40 may be integrated into a single integrated circuit in some implementations.

In order to display images, or to provide other features than displaying images, e.g., a touch input feature by a part of a user's body (e.g., a finger) or an external object (e.g., an electronic pen), a sound input/output feature, a capturing feature, a wireless communication feature, etc., the display device uses electric signals or electromagnetic signals. Accordingly, in order to drive the display device 1, electrical energy must be supplied. To this end, the display device 1 may include a built-in battery which stores electrical energy or may use electrical energy supplied from an external source.

The display device 1 may include the flexible circuit board 500 to provide the wireless charging function. The flexible circuit board 500 may perform the wireless charging function for an external electronic device by receiving electric energy from a built-in battery of the display device 1 or from an external source to generate a magnetic field. Examples of the external electronic device may include, but are not limited to, an electronic pen, a wireless earphone, a smart watch, and other display devices.

Figure 7:
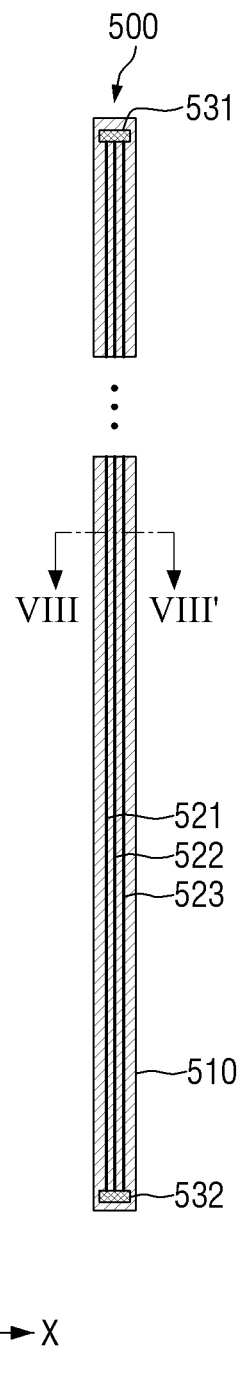
FIG. 7 is a plan view of a flexible circuit board according to an embodiment.
Figure 8:
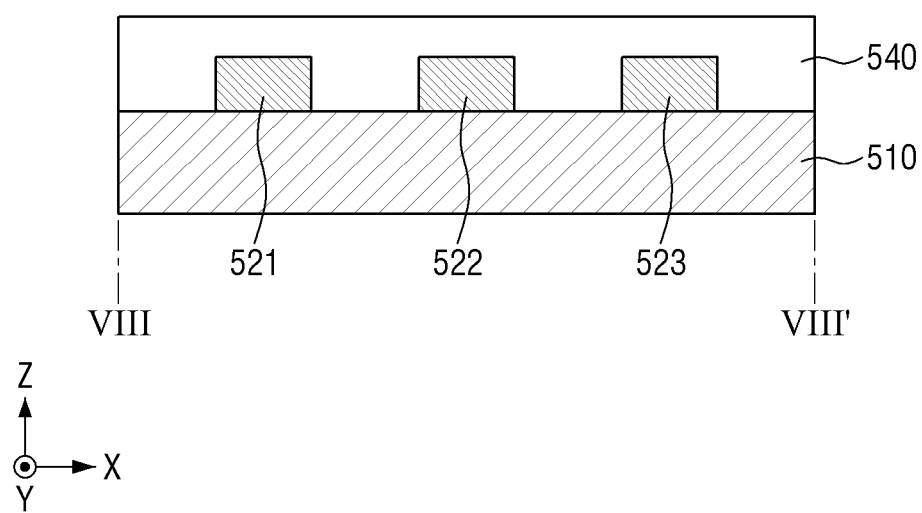
FIG. 8 is a cross-sectional view of the flexible circuit board taken along line VIII-VIII' of FIG. 7.

FIG. 7 is a plan view of a flexible circuit board according to an embodiment. FIG. 8 is a cross-sectional view of the flexible circuit board taken along line VIII-VIII' of FIG. 7.

Referring to FIGS. 7 and 8, the flexible circuit board 500 according to an embodiment may include a base substrate 510, a plurality of conductive lines 521, 522 and 523 disposed on the base substrate 510, a cover layer 540 disposed on the base substrate 510 and the plurality of conductive lines 521, 522 and 523, and a plurality of connection portions 531 and 532.

In FIG. 7, the cover layer 540 is omitted in order to describe the arrangement structure of the plurality of conductive lines 521, 522 and 523.

The base substrate 510 may be made of a flexible material. For example, the base substrate 510 may include, but is not limited to, one of polyimide, polyester, poly phenylene vinylene, and polyethylene terephthalate (PET). Accordingly, the flexible circuit board 500 may be bent or folded.

The base substrate 510 may have a rectangular shape having a width in the second direction Y greater than a width in the first direction X when viewed from the top. The shape of the base substrate 510 may be substantially identical to that of the flexible circuit board 500. In other words, the flexible circuit board 500 according to an embodiment may have a bar shape having the width of the vertical side greater than the width of the horizontal side when viewed from the top.

The width of the base substrate 510 in the first direction X may be smaller than the width of the non-active area NAR disposed on both sides of the active area AR, or may be smaller than the width of the non-active area NAR disposed on the upper or lower side of the active area AR in the second direction Y. It is, however, to be understood that the disclosure is not limited thereto. For example, the width of the base substrate 510 in the first direction X may be greater than or substantially equal to the width of the non-active area NAR disposed on both sides of the active area AR in the first direction X.

The width of the base substrate 510 in the second direction Y may be greater than the sum of the width of the two shorter sides and the width of the two longer sides of the active area AR. Accordingly, the flexible circuit board 500 may be arranged in a shape surrounding the active area AR as it is bent or folded at the corners of the active area AR.

The conductive lines 521, 522 and 523 may extend in the second direction Y and spaced apart from one another in the first direction X. Although the plurality of conductive lines 521, 522 and 523 includes three conductive lines in the example shown in FIG. 7, the disclosure is not limited thereto. For example, the plurality of conductive lines may include four or more conductive lines, two conductive lines, or only one conductive line. In some implementations, only one conductive line may be formed. In the following description, the plurality of conductive lines 521, 522 and 523 comprises three conductive lines for convenience of illustration but the number of conductive lines is not limited three, as described above.

The distances between the plurality of conductive lines 521, 522 and 523 in the first direction X are not particularly limited as long as they can be electrically insulated from one another.

Each of the plurality of conductive lines 521, 522 and 523 may include a metal material such as copper (Cu), silver (Ag), nickel (Ni) and tungsten (W). The plurality of conductive lines 521, 522 and 523 may be formed via a photolithography process or via a metal plating process. It should be noted that the method of forming the plurality of conductive lines 521, 522 and 523 is not limited thereto.

Each of the plurality of conductive lines 521, 522 and 523 may be made up of a single layer, but the disclosure is not limited thereto. It may be made up of multiple layers sequentially stacked on the base substrate 510. In such case, each of the plurality of conductive lines 521, 522 and 523 may include a layer performing various functions such as a barrier layer and a capping layer for protecting the lines from external impacts.

The cover layer 540 may be disposed on the base substrate 510 and the plurality of conductive lines 521, 522 and 523. The cover layer 540 can prevent oxygen or moisture from permeating into the plurality of conductive lines 521, 522 and 523. The cover layer 540 may include an insulating material having flexible properties. For example, the cover layer 540 may include, but is not limited to, polyimide.

The plurality of connection portions 531 and 532 may be disposed on distal ends of the flexible circuit board 500 on the cover layer 540. The plurality of connection portions 531 and 532 may be coupling members for electrically connecting the plurality of conductive lines 521, 522 and 523 with pads or lines on another substrate. Each of the first connection portion 531 and the second connection portion 532 may be a connector. It should be understood that the disclosure is not limited thereto. For example, each of the first connection portion 531 and the second connection portion 532 may be an anisotropic conductive film (ACF).

The plurality of connection portions 531 and 532 may include a first connection portion 531 disposed at the upper end and a second connection portion 532 disposed at the lower end in the second direction Y in which the plurality of conductive lines 521, 522 and 523 extend. Each of the plurality of conductive lines 521, 522 and 523 may be electrically connected to a metal pattern of each of the plurality of connection portions 531 and 532 through a contact hole formed through the cover layer 540.

The first connection portion 531 and the second connection portion 532 are physically separated from each other before the flexible circuit board 500 is folded or bent. When the flexible circuit board 500 is folded or bent, the first connection portion 531 and the second connection portion 532 are electrically connected to pads or lines on another substrate, and thus the first connection portion 531 and the second connection portion 532 may be electrically connected to each other through a conductive line on the another substrate.

Although the plurality of conductive lines 521, 522 and 523 of the flexible circuit board 500 is formed on a single layer in the example shown in FIG. 8, the disclosure is not limited thereto. The plurality of conductive lines 521, 522 and 523 of the flexible circuit board 500 may be disposed on different layers. The plurality of conductive lines disposed on different layers may overlap one another in the third direction Z or may be staggered in the third direction Z. In such case, the flexible circuit board 500 may include an insulating film disposed between the plurality of conductive lines disposed on different layers. At least one of the plurality of conductive lines disposed on one layer may be connected to a plurality of conductive lines disposed on another layer through a contact hole formed in the insulating film disposed between the plurality of conductive lines.

Referring back to FIGS. 2 to 6, the flexible circuit board 500 may be disposed on the rear surface of the display panel 10. The flexible circuit board 500 may be attached to the rear surface of the display panel 10 through a first adhesive member AD1. The first adhesive member AD1 may include an adhesive composition. For example, the first adhesive member AD1 may include one of a pressure-sensitive adhesive, an adhesive sheet, a liquid adhesive, and a double-sided tape. However, the first adhesive member AD1 is not limited thereto.

Layers having various functions, a substrate sheet, etc. may be disposed between the display panel 10 and the flexible circuit board 500. The flexible circuit board 500 may generate a magnetic field on the front surface of the display device 1 by receiving an electric current from the touch driving circuit 40. Accordingly, it is desired that a layer, a substrate, a sheet, etc. disposed between the display panel 10 and the flexible circuit board 500 do not include a metal material. For example, a shielding sheet for blocking a magnetic field, a heat dissipating member including a metal material and having a heat dissipation function, etc., should be disposed on the rear surface of the flexible circuit board 500.

The flexible circuit board 500 may be formed as a single piece and may be disposed to surround the active area AR. For example, the flexible circuit board 500 may be bent at upper corners and right corner of the lower end of the display panel 10 to surround the active area AR when viewed from the top. On the contrary, when viewed from the rear surface of the display device 1, the flexible circuit board 500 may be bent at upper corners and left corner of the lower end of the main region MR (see FIG. 3) to surround the active area AR.

The flexible circuit board 500 may include a part that does not overlap the active area AR. The part of the flexible circuit board 500 that does not overlap the active area AR may surround approximately at least half the edge of the active area AR. The flexible circuit board 500 may be disposed in the non-active area NAR, may not overlap the active area AR, and may surround at least three-fourth of the edges of the active area AR, or completely surround the edges of the active area AR. It is, however, to be understood that the disclosure is not limited thereto.

As a specific example, when the active area AR has a rectangular shape, the active area AR may include a first side disposed on the first side in the first direction X, a second side disposed on the second side in the first direction X, a third side disposed on the first side in the second direction Y, and a fourth side disposed on the second side in the second direction Y. The flexible circuit board 500 may include a first area extending in the second direction Y, a second area extending in the first direction X, a first corner area disposed between the first area and the second area to connect them, a third area extending in the direction opposite to the second direction Y, a second corner area disposed between the second area and the third area to connect them, a fourth area extending in the direction opposite to the first direction X, a third corner area disposed between the third area and the fourth area to connect them, a fifth area extended in the direction opposite to the second direction Y, and a fourth corner area disposed between the fourth area and the fifth area to connect them.

In such case, the first area, the second area, the third area and the fourth area of the flexible circuit board 500 may be disposed around the first side, the second side, the third side and the fourth side of the active area AR, respectively. The first corner area, the second corner area, the third corner area and the fourth corner area of the flexible circuit board 500 may be disposed adjacent to the corners of the active area AR, respectively.

The width of the first area of the flexible circuit board 500 in the second direction Y may be greater than the width of the first side of the active area AR in the second direction Y. The width of the second area of the flexible circuit board 500 in the first direction X may be greater than the width of the second side of the active area AR in the first direction Y. The width of the first area of the flexible circuit board 500 in the second direction Y may be substantially identical to the sum of the width of the third area and the width of the fifth area of the flexible circuit board 500. The width of the second area of the flexible circuit board 500 in the first direction X may be greater than the width of the fourth area of the flexible circuit board 500 in the first direction X.

According to such a structure, the flexible circuit board 500 may not overlap the active area AR in the third direction X and may have a loop shape that surrounds at least half of the active area AR. Herein, the loop shape may include a closed-loop shape completely surrounding at least a part of the active area AR, and an open-loop shape that does not completely surround the at least a part of the active area AR but surrounds at least a half of the at least a part of the active region AR.

The flexible circuit board 500 may include a part that overlaps the active area AR. For example, one of the plurality of conductive lines 521, 522 and 523 of the flexible circuit board 500 is disposed to surround along the boundary between the active area AR and the non-active area NAR, so that it may be disposed across the non-active area NAR and the active area AR. In addition, the flexible circuit board 500 may be disposed to traverse at least a part of the active area AR.

In FIGS. 2 and 3, as the active area AR has a rectangular shape, the flexible circuit board 500 is disposed in a rectangular shape that does not overlap the active area AR and surrounds the active area AR. It should be understood that the disclosure is not limited thereto. The shape of the flexible circuit board 500 may vary depending on the shape of the active area AR and may have a variety of shapes when viewed from the top such as a square, other polygons, a circle and an oval, exposing at least a part of the active area AR.

When the flexible circuit board 500 is bent at right angle when viewed from the top, the flexible circuit board 500 may have an overlapped portion in which one portion of the flexible circuit board 500 overlap another portion of the flexible circuit board 500 at the bent area (or corner area), as shown in FIG. 4. The overlapped portion may have a triangular shape in a plan view in which the flexible circuit board 500 are overlapped each other to form three layers of the flexible circuit board 500.

An adhesive may be applied between the flexible circuit board in the overlapped portion to fix the overlapped portion each other, but the disclosure is not limited thereto. For example, the flexible circuit board 500 in the overlapped portion may be fixed to other layers, substrates, sheets, etc. through additional adhesive layers.

When viewed from the rear surface of the display device 1, the part of the flexible circuit board 500 disposed in the non-active area NAR on the right side of the active area AR may be disposed to at least partially overlap the main circuit board 20 in the third direction Z. The part of the flexible circuit board 500 bent at the left corner of the non-active area NAR on the lower side may extend in the direction opposite to the first direction X and then bent toward the lower side (in the direction opposite to the second direction Y) to at least partially overlap the main circuit board 20 in the third direction Z.

Although the both ends of the flexible circuit board 500 are disposed at the right side of the rear surface of the main circuit board 20 in the third direction Z in the example shown in FIG. 3, the disclosure is not limited thereto. They may be disposed on the center or the left side of the rear surface of the main circuit board 20. In addition, one end of the flexible circuit board 500 may be disposed on the right side of the rear surface of the main circuit board 20, and the other end thereof may be disposed on the left side of the rear surface of the main circuit board 20. The locations of the ends may vary variously.

At least a part of the flexible circuit board 500 overlapping the main circuit board 20 in the third direction Z may be bent with a curvature in the direction opposite to the third direction Z (downward direction in the thickness direction). As the flexible circuit board 500 is bent, the surface of the flexible circuit board 500 may face an opposite direction of the display panel 10 through which an image is displayed. That is to say, the surface of the flexible circuit board 500 facing in the third direction Z may be bent so that it faces the outside and then faces in the opposite direction to the third direction Z.

The plurality of conductive lines 521, 522 and 523 of the flexible circuit board 500 may be arranged in this order from the outside to the inside. For example, the first conductive line 521 may be disposed on the outer side, the third conductive line 523 may be disposed on the inner side, and the second conductive line 522 may be disposed between the first conductive line 521 and the third conductive line 523.

The plurality of conductive lines 521, 522 and 523 may overlap other conductive lines at the overlapped portion where the flexible circuit board 500 is bent when viewed from the top. For example, in the example shown in FIG. 3, the second conductive line 522 may overlap the first conductive line 521 in the third direction Z, and the third conductive line 523 may overlap the first conductive line 521 and the second conductive line 522 in the third direction Z. It should be noted that the conductive lines 521, 522 and 523 are surrounded by the base substrate 510 and the cover layer 540 as will be described later, and thus they are insulated from one another. Accordingly, the conductive lines 521, 522 and 523 may be electrically separated from one another at the overlapped portion where the flexible circuit board 500 is bent when viewed from the top.

Each of the first connection portion 531 and the second connection portion 532 may be electrically connected to the main circuit board 20.

When each of the first connection portion 531 and the second connection portion 532 is electrically connected to the main circuit board 20, the conductive lines 521, 522 and 523 of the flexible circuit board 500 may be electrically connected to a plurality of connection lines 21, 22 and 23 disposed on the main circuit board 20, respectively. Accordingly, the plurality of conductive lines 521, 522 and 523 and the plurality of connection lines 21, 22 and 23 may have a closed-loop structure.

For example, one end of the first conductive line 521 may be electrically connected to one end of the first connection line 21 through the first connection portion 531, and the other end of the first conductive line 521 may be electrically connected to the other end of the first connection line 21 through the second connection portion 532. Accordingly, the first conductive line 521 and the first connection line 21 may be electrically connected to each other to have a closed-loop structure. The second conductive line 522 may be electrically connected to the second connection line 22, and the third conductive line 523 may be electrically connected to the third connection line 23 to have closed-loop structures when viewed from the top.

The number of the plurality of connection lines 21, 22 and 23 on the main circuit board 20 may be substantially equal to the number of the conductive lines included in the plurality of conductive lines 521, 522 and 523 of the flexible circuit board 500. Although three connection lines 21, 22 and 23 are disposed on the main circuit board 20 so that the number is equal to the number of the three conductive lines 521, 522 and 523 of the flexible circuit board 500 in the example shown in FIGS. 2 and 3, it is to be understood that the number of connection lines on the main circuit board 20 may vary depending on the number of the plurality of conductive lines of the flexible circuit board 500.

As the conductive lines 521, 522 and 523 of the flexible circuit board 500 are electrically connected to the connection lines 21, 22 and 23 of the main circuit board 20, respectively, the plurality of conductive lines 521, 522 and 523 and the plurality of connection lines 21, 22 and 23 may work like three coils each of one turn disposed on the same plane. According to such a structure, the plurality of conductive lines 521, 522 and 523 and the plurality of connection lines 21, 22 and 23 may work in substantially the same manner as three coil of one turn.

As described above, the numbers of the plurality of conductive lines 521, 522 and 523 and the plurality of connection lines 21, 22 and 23 are not limited herein. Accordingly, the coils by the plurality of conductive lines 521, 522 and 523 and the plurality of connection lines 21, 22 and 23 may also have different numbers.

Although not shown in the drawings, the plurality of connection lines 21, 22 and 23 may be electrically connected to the touch driving circuit 40. In such case, the plurality of connection lines 21, 22 and 23 may be electrically connected to the touch driving circuit 40 individually, or may be connected to it together via a single line.

Figure 9:
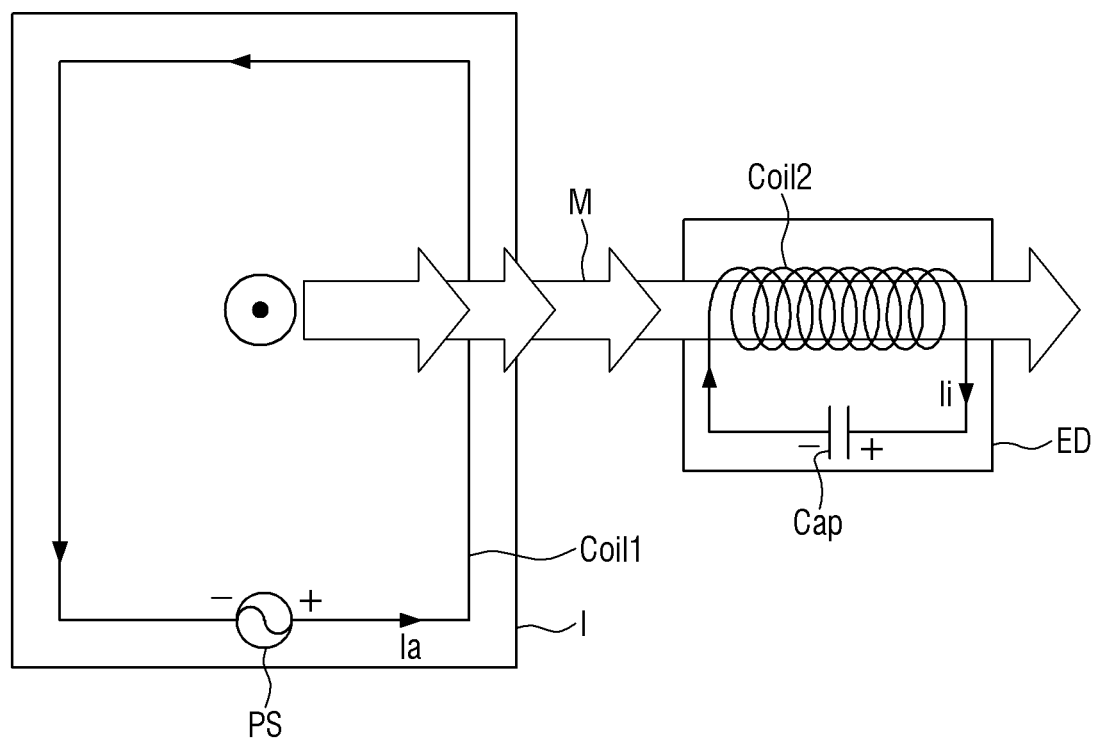
FIG. 9 is a view conceptually showing a wireless charging method according to an embodiment of the disclosure.

FIG. 9 is a view conceptually showing a wireless charging method according to an embodiment of the disclosure.

The plurality of conductive lines 521, 522 and 523 of the flexible circuit board 500 may work as three coils of one turn. However, for convenience of illustration, FIG. 9 simply depicts the plurality of conductive lines 521, 522 and 523 as a single first coil Coil1, and the touch driving circuit 40 for applying current to the plurality of conductive lines Coil1 (521, 522 and 523) as a power supply PS. In addition, an external electronic device ED includes a second coil Coil2 and a capacitor Cap.

Initially, AC current Ia flows through the first coil Coil1 when electric power is supplied from the power source PS. The AC current Ia flows through the first coil Coil1 periodically reverses direction and changes its magnitude continuously with time, and thus magnetic energy is generated. Such magnetic energy may be emitted in the form of magnetic field M.

If the AC current Ia flows in a counter clockwise direction in the first coil Coil1 when viewed from the top, the magnetic field M comes out of a plane in which the first coil Coil1 is disposed. On the contrary, if the AC current Ia flows in a clockwise direction in the first coil Coil1 when viewed from the top, the magnetic field M goes into the plane in which the first coil Coil1 is disposed.

Then, if the external electronic device ED is placed to overlap the magnetic field M emitted from the first coil Coil1 when viewed from the top, inductive coupling between the first coil Coil1 and the second coil Coil2 occurs. As a result, an induced current Ii is generated by the magnetic field M in the second coil Coil2. The induced current Ii may flow in the counterclockwise direction.

The induced current Ii thus generated may flow via the second coil Coil2 and the capacitor Cap may be charged with electric charges by the induced current Ii. The external electronic device ED may use the electric charge stored in the capacitor Cap as electrical energy for driving the external electronic device ED.

As such, the display device 1 can provide a wireless charging function utilizing the magnetic induction which supplies energy to an external electronic device by generating a magnetic field using the plurality of conductive lines 521, 522 and 523 through which electric current flows.

As another example, if an external electronic device ED includes a coil having the same resonance frequency as the coil formed by the plurality of conductive lines 521, 522 and 523 of the display device 1, the display device 1 can also provide the wireless charging function utilizing magnetic resonance of transferring energy to the external electronic device (ED) by generating a magnetic field that vibrates at a particular frequency.

Hereinafter, the magnetic induction will be described in detail as an example of the wireless charging scheme. It is, however, to be understood that the following description can be equally applied to magnetic resonance which is a wireless charging scheme using a coil.

In addition, the embodiment will be described in more detail using an electronic pen (e.g., a stylus pen) as an external electronic device provided with a wireless charging function from the display device 1 as an example. It should be noted that the technical idea of the embodiments is not limited thereto but may be applied to a variety of external electronic devices.

The intensity and distribution of the magnetic field generated by the current flowing through the plurality of conductive lines 521, 522 and 523 may be determined depending on the area of the closed-loop structure of the plurality of conductive lines 521, 522 and 523 and the plurality of connection lines 21, 22 and 23 when viewed from the top, i.e., the area of the inner side of the closed-loop structure. In particular, the magnetic fields generated in the inner side of the closed-loop structure of the plurality of conductive lines 521, 522 and 523 and the plurality of connection lines 21, 22 and 23 constructively interfere with each other, and thus the strength of the magnetic field on the inner side of the closed-loop structure may be greater than the strength of the magnetic field generated on the outer side of the closed-loop structure.

The display device 1 may include a wireless charging area CA. The wireless charging area CA may be defined as an area where magnetic fields generated by the plurality of conductive lines 521, 522 and 523 constructively interfere with each other to have a stronger intensity. Specifically, the wireless charging area CA may be defined as an internal space surrounded by the plurality of conductive lines 521, 522 and 523. Specifically, in a plane formed by the horizontal line (the first direction X) and the vertical line (the second direction Y), the wireless charging area CA may be defined as the plane surrounded by the plurality of conductive lines 521, 522 and 523 and the space on the plane surrounded by the plurality of conductive lines 521, 522 and 523 in the third direction Z.

The shape of the wireless charging area CA may be a rectangle having sides in the second direction Y longer than sides in the first direction X when viewed from the top, but the disclosure is not limited thereto. The wireless charging area CA may have a variety of shapes, e.g., other polygons such as a rectangle having sides in first direction X longer than sides in the second direction Y, a square, a diamond and a hexagon, or a circle, an oval, etc.

The space of the wireless charging area CA in the third direction Z may vary depending on the strength of the magnetic field, the number and size of turns of the coil included in an electronic pen, etc. For example, the space of the wireless charging area in the third direction Z may have, but is not limited to, a width of approximately 10 cm to 20 cm in the third direction Z. In the following description, for convenience of illustration, description will focus on the wireless charging area CA on the plane formed by the line in the first direction X and the line in the second direction Y.

The wireless charging area CA may overlap the active area AR when viewed from the top. For example, when the plurality of conductive lines 521, 522 and 523 having the loop structure is disposed to surround the active area AR along the non-active area NAR, the wireless charging area CA and the active area AR may overlap each other when viewed from the top. Although the wireless charging area CA completely overlaps the active area AR according to the embodiment of the disclosure, the disclosure is not limited thereto. As a non-limiting example, if the plurality of conductive lines 521, 522 and 523 is disposed at least partially in the active area AR, the area of the wireless charging area CA may be smaller than the area of the active area AR when viewed from the top. If the plurality of conductive lines 521, 522 and 523 is disposed at the outermost positions of the non-active area NAR, the wireless charging area CA may overlap at least partially the active area AR and the non-active area NAR, and the area of the wireless charging area CA may be greater than the area of the active area AR when viewed from the top.

The shape, area, etc. of the wireless charging area CA may vary depending on a configuration of the flexible circuit board 500 and may or may not overlap the active area AR and/or the non-active area NAR. The wireless charging area CA may overlap each of the active region AR and the non-active region NAR in a variety of ways.

The area of the wireless charging area CA may be proportional to the area of the inner side of the closed-loop structure formed by the plurality of conductive lines 521, 522 and 523 and the plurality of connection lines 21, 22 and 23.

According to the embodiment of the disclosure, the flexible circuit board 500 has a bar shape having a longer side in one direction when viewed from the top, and is folded or bent to have the loop shape surrounding the active area AR in order to form the conductive lines of a coil or closed-loop structure in the display device 1. In this manner, it may be advantageous in realizing a large wireless charging area, reducing unnecessary costs, and reducing the weight of the display device 1.

In addition, since the base substrate 510 is not disposed in the area surrounded by the flexible circuit board 500, it may be advantageous in preventing that the direction of the magnetic field generated by the plurality of conductive lines 521, 522 and 523 is changed or that the strength of the magnetic field is reduced.

As another example, in the area surrounded by the flexible circuit board 500, other layers, sheets, etc. may be disposed so that they do not overlap the flexible circuit board 500 in the thickness direction. According to such a structure, it may be advantageous to increase the space utilization of the display device 1 and reduce the overall thickness of the display device 1.

Referring back to FIGS. 5 and 6, the display device may further include a heat dissipation member 600 disposed on the rear surface of the flexible circuit board 500. The heat dissipation member 600 may be attached to the rear surface of the flexible circuit board 500 through a second adhesive member AD2. The second adhesive member AD2 may be substantially identical to the first adhesive member AD1. It is, however, to be understood that the disclosure is not limited thereto.

The heat dissipation member 600 may be a metal film such as a copper alloy, copper, nickel, ferrite and silver having excellent thermal conductivity. Accordingly, heat generated in the display device 1 can be released to the outside by the heat dissipation member 600.

Figure 10:
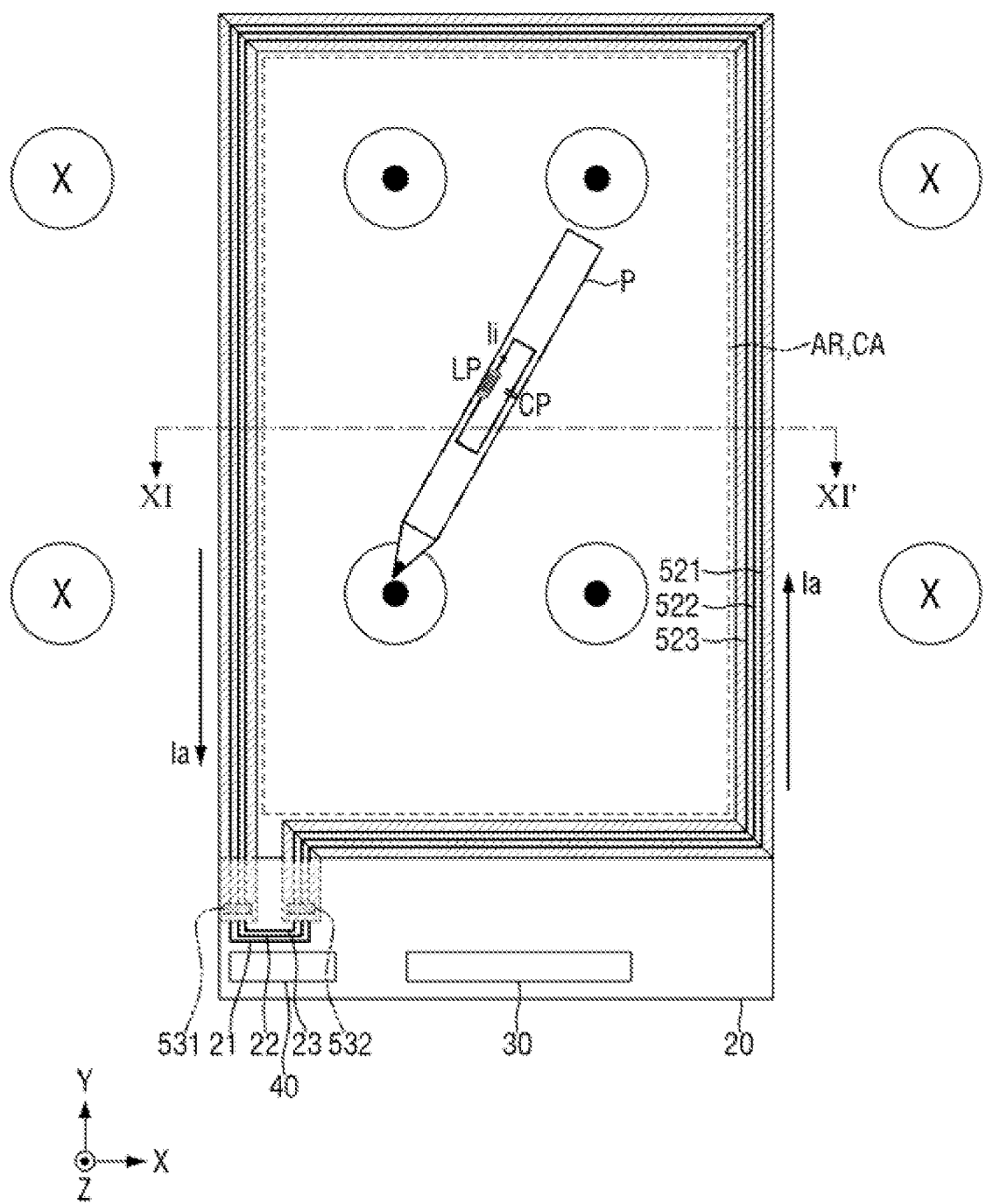
FIG. 10 is a plan view showing a wireless charging method of a display device according to an embodiment.
Figure 11:
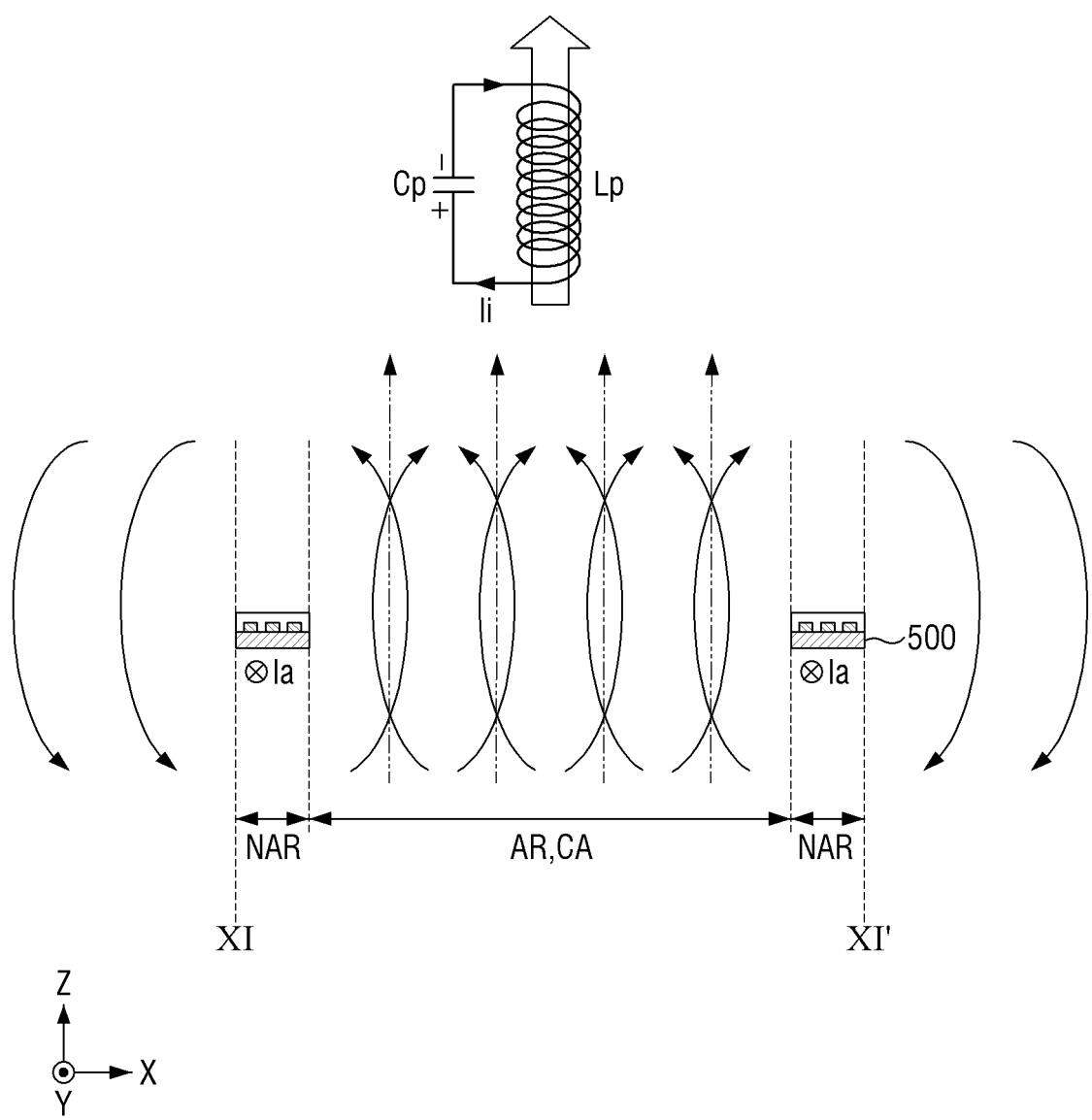
FIG. 11 is a cross-sectional view of the flexible circuit board, taken along line XI-XI' of FIG. 10.
Figure 12:
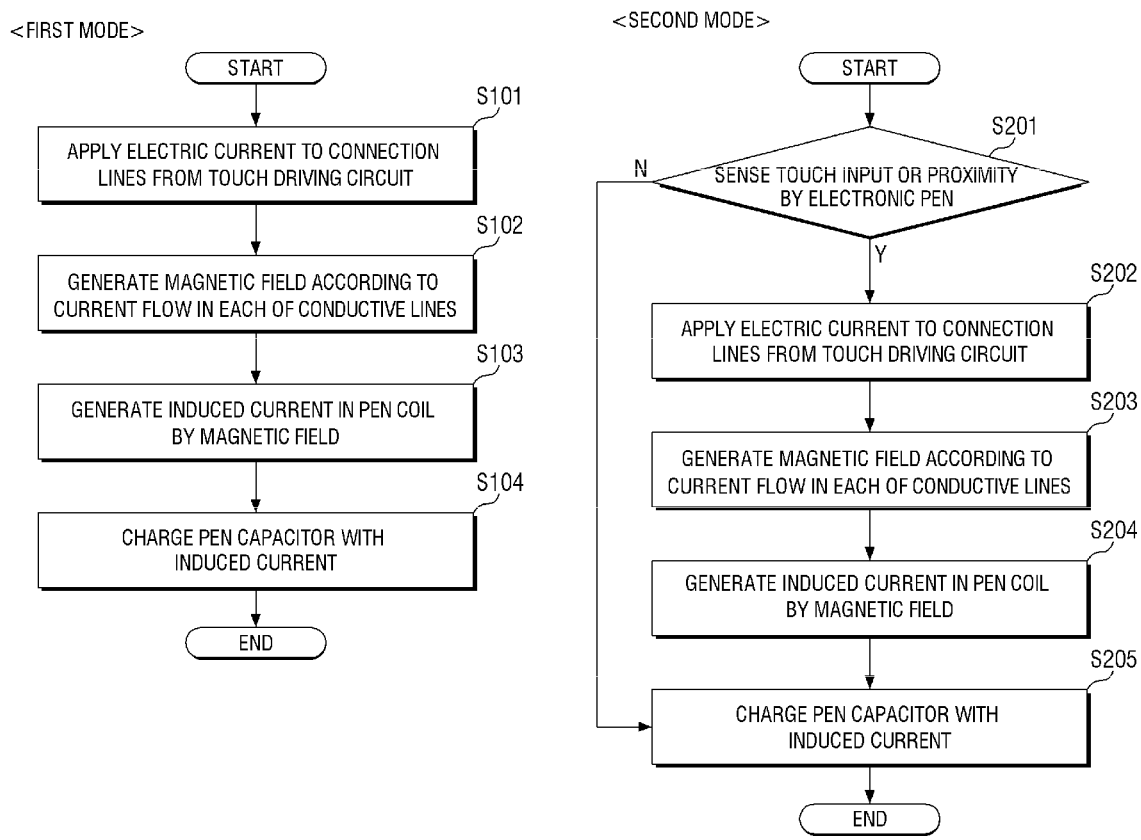
FIG. 12 is a flowchart for illustrating the wireless charging method according to the embodiment of the disclosure.

FIG. 10 is a plan view showing a wireless charging method of a display device according to an embodiment. FIG. 11 is a cross-sectional view of the flexible circuit board, taken along line XI-XI' of FIG. 10. FIG. 12 is a flowchart for illustrating the wireless charging method according to the embodiment of the disclosure.

FIGS. 10 and 11 show the direction of the current Ia supplied from the touch driving circuit 40, the direction of the magnetic field generated according to the flow of the current Ia flowing through the plurality of conductive lines 521, 522 and 523 of the flexible circuit board 500, and the direction of the induced current Ii of an electronic pen P. In addition, FIG. 11 shows a direction of the magnetic field due to constructive interference which is represented by an alternate long and two short dashes line.

Referring to FIGS. 10 to 12, when the electronic pen P is placed on the wireless charging area CA, the display device 1 can provide a wireless charging function to the electronic pen P.

The display device 1 may be operated in a first mode and a second mode according to a method for providing a wireless charging function. In the first mode, electric current is supplied constantly from the touch driving circuit 40 to the plurality of conductive lines 521, 522 and 523 of the flexible circuit board 500, so that the wireless charging function is provided continuously unless a specific control signal is input. In the second mode, electric current is supplied from the touch driving circuit 40 to the plurality of conductive lines 521, 522 and 523 of the flexible circuit board 500 if a touch input or proximity of an electronic pen P is detected, so that the wireless charging function is provided. The display device 1 may be designed so that a user can choose whether the display device 1 provides the wireless charging function in the first mode or the wireless charging function in the second mode. Alternatively, the display device 1 may be designed so that it is operated in the first mode or in the second mode depending on the battery state of the display device 1. Besides, the display device 1 may be controlled in a variety of ways.

For example, in the first mode, the wireless charging function may be turned on or off by the user. In addition, in the second mode, the wireless charging function may be turned on after a touch input by the electronic pen P is detected, and the wireless charging function may be turned off after a predetermined period has elapsed since the last touch input of the electronic pen P is detected. Herein, the predetermined period may be either a period designated by the user or a preset period. It should be understood, however, that the disclosure is not limited thereto. The control method in each of the first mode and the second mode, the period of providing wireless charging, etc. may be variously modified.

In the following description, the display device 1 provides the wireless charging function in the first mode or the second mode by the user's selection as an example, but the disclosure is not limited thereto. The display device 1 may provide only the wireless charging method in the first mode or only the wireless charging method in the second mode. The control method may be modified in a variety of ways as long as the display device 1 can provide the wireless charging function.

Initially, the method of providing a wireless charging function of the display device 1 in the first mode will be described.

In the first mode, the touch driving circuit 40 supplies the current Ia to the plurality of connection lines 21, 22 and 23 (step S101). The current Ia is constantly supplied until the wireless charging function is externally or internally turned off. The supplied current Ia may flow to the plurality of conductive lines 521, 522 and 523 of the flexible circuit board 500 through the first connection portion 531 and/or the second connection portion 532.

Since the plurality of conductive lines 521, 522 and 523 of the flexible circuit board 500 and the plurality of connection lines 21, 22 and 23 of the main circuit board 20 are electrically connected as described above, a current path having a closed-loop structure may be formed by the plurality of conductive lines 521, 522 and 523 and the plurality of connection lines 21, 22 and 23.

For example, the current Ia supplied to the first connection line 21 may circulate along a current path of the closed-loop structure formed by the first conductive line 521 and the first connection line 21, the current Ia supplied to the second connection line 22 may circulate along a current path of the closed-loop structure formed by the second conductive line 522 and the second connection line 22, and the current Ia supplied to the third connection line 23 may circulate along a current path of the closed-loop structure formed by the third conductive line 523 and the third connection line 23.

When the current path of the closed-loop structures are formed by the conductive lines and the connection lines, a magnetic field is generated (step S102).

For example, when current flows in the counterclockwise direction in the current path of the closed-loop structures, the magnetic field may come out of the plane in which the plurality of conductive lines 521, 522 and 523 and the plurality of connection lines 21, 22 and 23 are disposed on the inner side of the closed-loop structure and goes into the plane in which the plurality of conductive lines 521, 522 and 523 and the plurality of connection lines 21, 22 and 23 are disposed on the outer side of the closed-loop structure according to Ampere's right-hand screw rule. On the contrary, when current flows in the clockwise direction in the current path of the closed-loop structures, the magnetic field may goes into the plane in which the plurality of conductive lines 521, 522 and 523 and the plurality of connection lines 21, 22 and 23 are disposed on the inner side of the closed-loop structure and comes out of the plane in which the plurality of conductive lines 521, 522 and 523 and the plurality of connection lines 21, 22 and 23 are disposed on the outer side In the following description, the current flows in the counterclockwise direction, but the disclosure is not limited thereto. The same principle can be applied even when the current flows in the clockwise direction.

In this instance, the magnetic fields generated at sides of the flexible circuit board 500 are constructively interfere with each other on the inner side of the rectangular closed-loop structure to generate a magnetic field directed in the third direction Z. The strength of the magnetic field directed to the third direction Z is larger than the strength of the magnetic field generated on the outer side due to the constructive interference. Although magnetic fields generated at the both sides of the flexible circuit board 500 in the first direction X constructively interfere with each other in the example shown in FIG. 11, magnetic fields generated on the both sides of the flexible circuit board 500 in the second direction Y may also constructively interfere with each other.

Because the magnetic fields are also generated on the outer side of the closed-loop structure and magnetic field components in the vertical direction are also included in the magnetic fields generated on the outer side of the closed-loop structure, wireless charging is possible on the outer side of the closed-loop structure. However, since the strength of the magnetic field in the vertical direction is relatively weak on the outer side of the closed-loop structure compared to the magnetic field on the inner side of the closed-loop structure, the efficiency of wireless charging may be relatively low. Accordingly, the wireless charging area CA may be the inner side of the closed-loop structure in which the magnetic fields constructively interfere with each other and thus the charging efficiency is relatively high, as described above.

The electronic pen P may include a pen coil LP and a pen capacitor CP. One end of the pen coil LP is connected to the first electrode of the pen capacitor CP, and the other end of the pen coil LP is connected to the second electrode of the pen capacitor CP.

When the electronic pen P is disposed on the inner side of the closed-loop structure, the magnetic field directed in the third direction Z may pass through the pen coil LP of the electronic pen P. As a result, an induced current Ii is generated in the pen coil LP (step S103). The induced current Ii thus generated flows through the pen coil LP, and accordingly, the pen capacitor CP is charged to the capacitance (step S104).

The electronic pen P may use the electric charge stored in the pen capacitor CP as electrical energy for driving the electronic pen P.

The magnitude of the induced current Ii is proportional to the strength of the magnetic field and the strength of the magnetic field passing through the pen coil LP may vary depending on the position of the electronic pen P. That is to say, the time taken to charge the pen capacitor CP to the capacitance may vary depending on the position of the electronic pen P.

The strength of the magnetic field may become weaker as a distance from the plurality of conductive lines 521, 522 and 523 through which the current Ia flows increases. Therefore, when the electronic pen P is placed at the center of the inner side of the closed-loop structure, the strength of the magnetic fields is weaker, and thus it takes more time to charge the electronic pen P compared to when the electronic pen P is placed on the inner side of the closed-loop structure adjacent to the plurality of conductive lines 521, 522 and 523.

In contrast, according to the embodiment, the closed-loop structure of the flexible circuit board 500 is designed so that the strengths of the magnetic fields constructively interfering with each other in the wireless charging area CA are relatively uniform. Accordingly, it may be advantageous in reducing the charging time of the electronic pen P regardless of its position.

The method of providing the wireless charging function of the display device 1 in the second mode may be substantially identical to the method of providing the wireless charging function in the first mode, except that the wireless charging function is turned on when a touch input or proximity by the electronic pen P is detected. Description will focus on the difference between the second mode and the first mode.

In the second mode, it is determined whether a touch input or proximity by the electronic pen P is detected (step S201).

The touch input by the electronic pen P may be detected by the touch layer 12 of the display panel 10 to be described later. For example, when a touch input by the electronic pen P is made on the touch layer 12 including a first sensing electrode and a second sensing electrode, an electric field is formed between the first sensing electrode and the second sensing electrode to change the mutual capacitance, and the touch driving circuit 40 may detect a change in the capacitance to determine whether there is a touch input by the electronic pen P. It should be understood, however, that the method of detecting the touch input by the electronic pen P is not limited thereto.

The proximity of the electronic pen P may be detected by the closed-loop structure of the flexible circuit board 500. For example, when a current flows through the pen coil LP of the electronic pen P and a magnetic field generated by the current flowing through the pen coil LP generates an induced current in each of the plurality of conductive lines 521, 522 and 523 of the flexible circuit board 500, the touch driving circuit 40 detects the induced current Ii to thereby determine whether the electronic pen P is proximate to the display device. It should be understood, however, that the disclosure is not limited thereto. When the display device 1 includes a digitizer layer including a plurality of conductive patterns, the proximity of the electronic pen P may be detected by the digitizer layer. It is possible to determine whether the electronic pen P is proximate to it according to a variety of methods.

As such, the display device 1 may determine whether a touch input or proximity by the electronic pen P by various methods, and the touch driving circuit 40 supplies a current to the plurality of connection lines 21, 22 and 23 when there is a touch input or proximity by the electronic pen P (step S202).

Subsequently, the wireless charging function can be provided in the second mode in substantially the same manner as in the first mode (steps S203 to S205).

Figure 13:
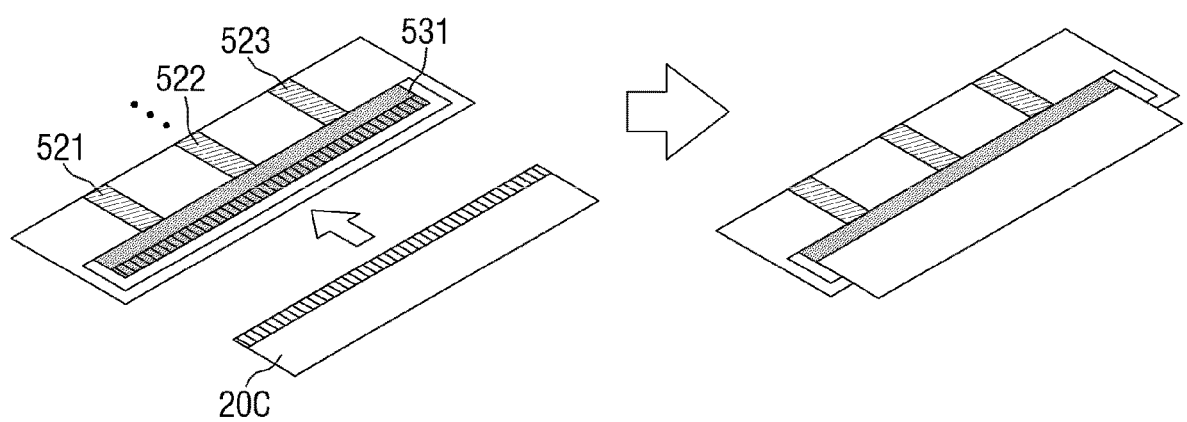
FIG. 13 is a perspective view showing an example of the first connection portion and a connector of the main circuit board connected thereto.
Figure 14:
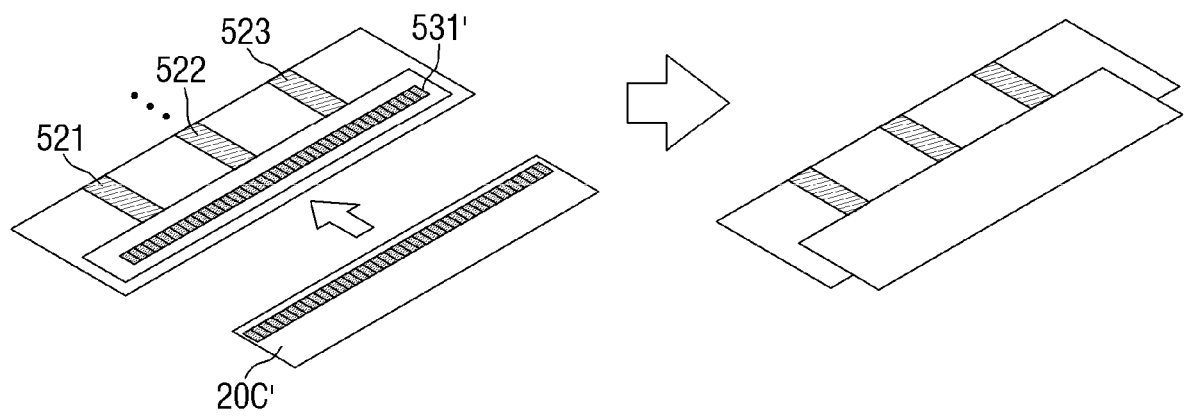
FIG. 14 is a perspective view showing another example of the first connection portion and a connector of the main circuit board connected thereto.

FIG. 13 is a perspective view showing an example of the first connection portion and a connector of the main circuit board connected thereto. FIG. 14 is a perspective view showing another example of the first connection portion and a connector of the main circuit board connected thereto.

The structures of the first connection portion 531 and the connector of the main circuit board 20 connected thereto will be described with reference to FIGS. 13 and 14 for convenience of illustration. It should be noted that the second connection portion 532 may also have substantially the same structure as the first connection portion 531.

Each of the first connection portion 531 and the second connection portion 532 may be a connector. Connectors are also disposed on the main circuit board 20 on which the first connection portion 531 and the second connection portion 532 are disposed.

Examples of the connector for electrically connecting the flexible circuit board 500 with the main circuit board 20 may include, but is not limited to, a zero insertion force (ZIF) connector that that requires very little force for insertion as shown in FIG. 13, a board-to-board (BTB) connector in which connectors formed on boards, respectively, are fastened as shown in FIG. 14. In addition, the connector may be implemented as various connectors such as a low insertion force (LIF) connector that is fixed with a flip, etc. while maintaining the connection between circuit boards with a low force and a non-ZIF connector that brings terminals into contact with by applying force.

As such, by applying the connectors to the first connection portion 531 and the second connection portion 532 of the flexible circuit board 500, it is possible to easily assemble and align the flexible circuit board 500 and the main circuit board 20 to connect them. In addition, it may be advantageous to enhance the physical connection force between the flexible circuit board 500 and the main circuit board 20.

Figure 15:
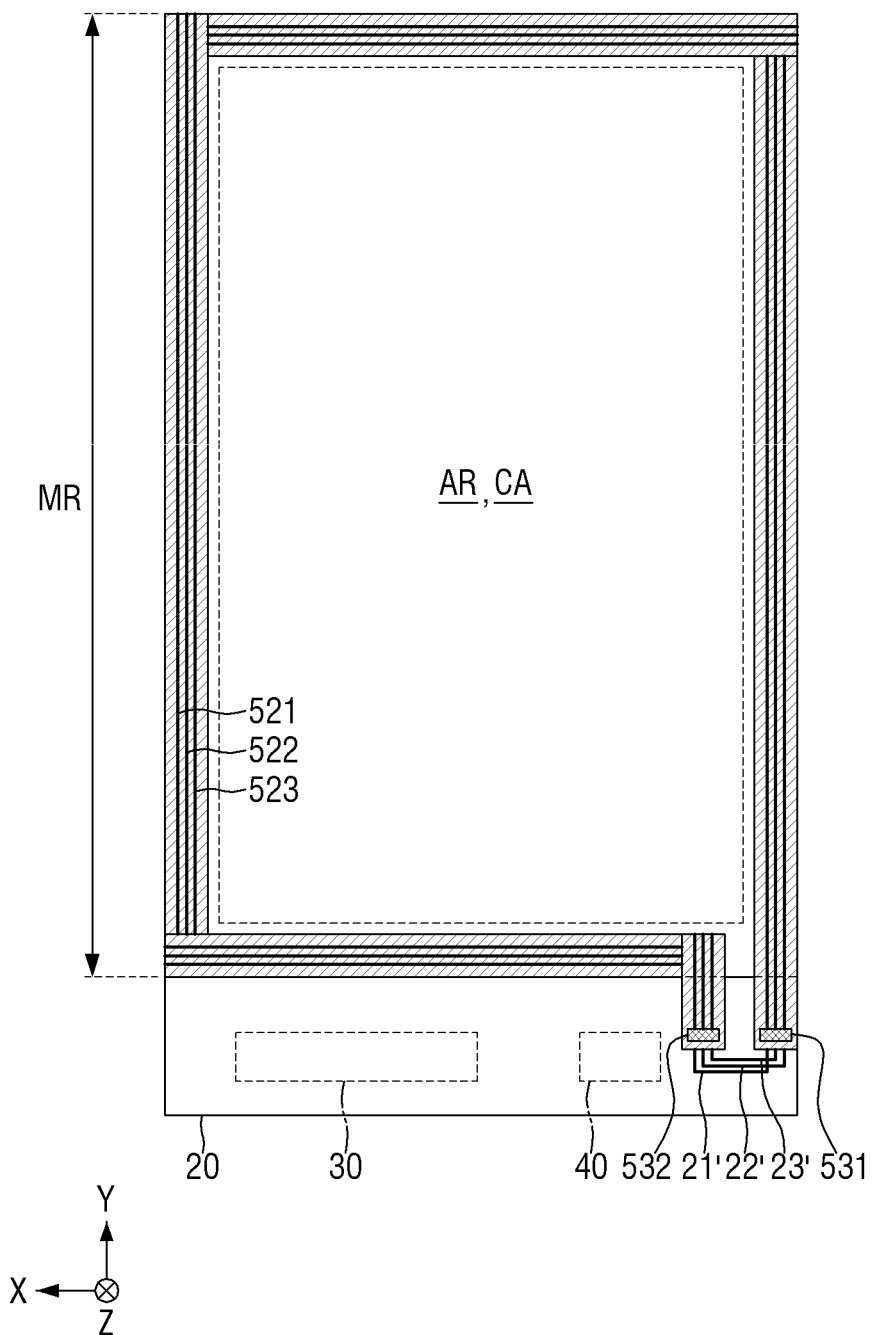
FIG. 15 is a plan view showing an arrangement structure of connection lines of a flexible circuit board according to another embodiment.

FIG. 15 is a plan view showing an arrangement structure of a plurality of connection lines according to another embodiment.

The embodiment of FIG. 15 is different from the embodiment of FIG. 3 in that a plurality of connection lines 21', 22' and 23' has a different arrangement structure, and accordingly a plurality of conductive lines 521, 522 and 523 and a plurality of connection lines 21', 22' and 23' are electrically connected to one another. The following description will focus on the difference.

Referring to FIG. 15, one end of the first connection line 21' may be electrically connected to one end of the third conductive line 523 through the first connection portion 531, and the other end may be electrically connected to the other end of the first conductive line 521 through the second connection portion 532.

One end of the second connection line 22' may be electrically connected to one end of the first conductive line 521 through the first connection portion 531, and the other end may be electrically connected to the other end of the second conductive line 522 through the second connection portion 532.

One end of the third connection line 23' may be electrically connected to one end of the second conductive line 522 through the first connection portion 531, and the other end may be electrically connected to the other end of the third conductive line 523 through the second connection portion 532.

In other words, one end of the first conductive line 521 may be electrically connected to the other end of the second conductive line 522 via the second connection line 22', one end of the second conductive line 522 may be electrically connected to the third conductive line 523 via the third connection line 23', and one end of the third conductive line 523 may be electrically connected to the other end of the first conductive line 521 via the first conductive line 521.

The first connection line 21', the second connection line 22' and the third connection line 23' may be electrically separated from one another. For example, although not specifically shown in the drawings, the first connection line 21', the second connection line 22' and the third connection line 23' may be formed on different layers of the main circuit board 20 and may be electrically insulated from one another. In such case, the first connection line 21', the second connection line 22' and the third connection line 23' may be electrically connected to the connectors of the main circuit board 20 through contact holes, respectively. It is, however, to be understood that the disclosure is not limited thereto.

The plurality of conductive lines 521, 522 and 523 and the plurality of connection lines 21', 22' and 23' may form a single current path. That is to say, when current is supplied from the touch driving circuit 40 to at least one of the plurality of connection lines 21', 22' and 23', the plurality of conductive lines 521, 522 and 523 and the plurality of connection lines 21', 22' and 23' may work as a coil of three turns. According to such a structure, it is advantageous to control the plurality of conductive lines 521, 522 and 523 and the plurality of connection lines 21', 22' and 23' so that the current having the same magnitude flows therethrough. Further, the areas of the closed-loop structures are relatively uniform, so that it may be advantageous to make uniform the strength of the magnetic fields generated in the lines.

FIG. 15 shows an example of the arrangement structure of the plurality of conductive lines 521, 522 and 523 where the plurality of conductive lines 521, 522 and 523 and the plurality of connection lines 21', 22' and 23' work as a coil of three turns. In another embodiment, the arrangement structure of each of the plurality of connection lines 21', 22' and 23' may be variously changed.

For example, one end of the first connection line 21' may be electrically connected to one end of the second conductive line 522 through the first connection portion 531, and the other end thereof may be electrically connected to the other end of the first conductive line 521 through the second connection portion 532. One end of the second connection line 22' may be electrically connected to one end of the third conductive line 523 through the first connection portion 531, and the other end thereof may be electrically connected to the other end of the second conductive line 522 through the second connection portion 532. One end of the third connection line 23' may be electrically connected to one end of the first conductive line 521, and the other end thereof may be electrically connected to the other end of the third conductive line 523. In this manner, the conductive lines and connection lines may work as a coil of three turns.

Figure 16:
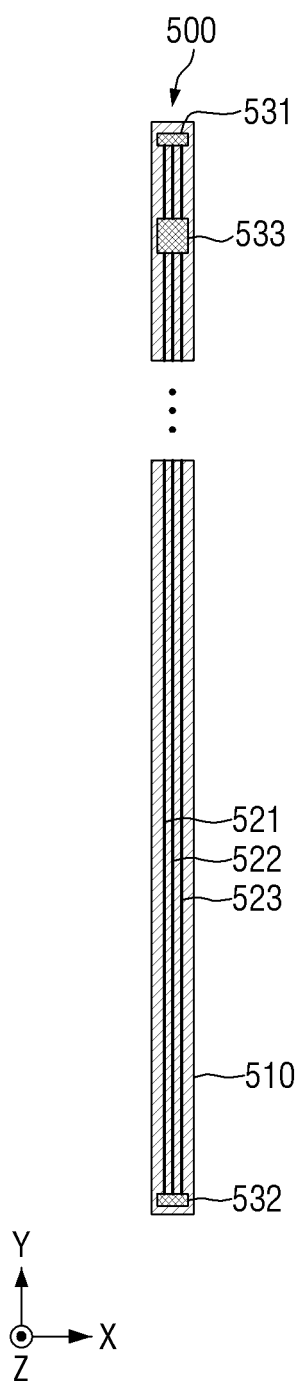
FIG. 16 is a plan view of a flexible circuit board according to another embodiment.
Figure 17:
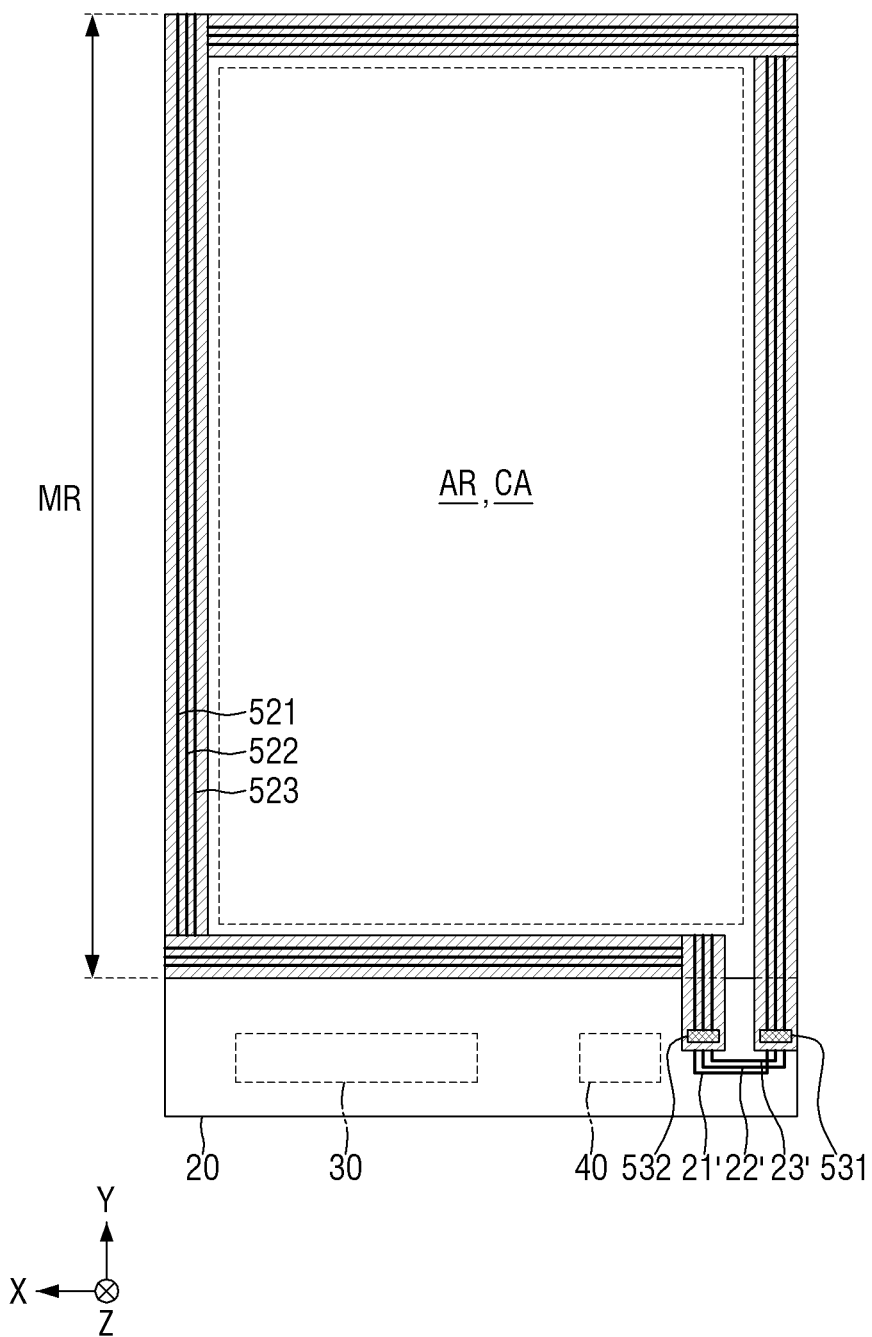
FIG. 17 is a plan view showing an arrangement structure of the flexible circuit board of FIG. 16 when viewed from the rear surface of the display device.

FIG. 16 is a plan view of a flexible circuit board according to another embodiment. FIG. 17 is a plan view showing an arrangement structure of the flexible circuit board of FIG. 16 when viewed from the rear surface of the display device.

The embodiment of FIGS. 16 and 17 is different from the embodiment of FIGS. 3 and 7 in that a flexible circuit board 500 further includes a third connection portion 533, and a second connection portion 532 is connected to the third connection portion 533 and a closed-loop structure is formed by a plurality of conductive lines 521, 522 and 523. The following description will focus on the differences.

The flexible circuit board 500 may further include a third connection portion 533. The third connection portion 533 may be substantially identical to the connector of the main circuit board 20 connected to the first connection portion 531 in FIG. 13 or 14.

The third connection portion 533 may be disposed near the first connection portion 531 disposed at one end of the flexible circuit board 500. The third connection portion 533 may be electrically connected to each of the first conductive line 521, the second conductive line 522 and the third conductive line 523 through a contact hole passing through an insulating layer.

The flexible circuit board 500 may have an arrangement shape that the flexible circuit board 500 is bent at the lower left corner of the main region MR and extend in the direction opposite to the first direction X, and the other end of the flexible circuit board 500 is connected to a part of the flexible circuit board 500 near one end when viewed from the rear side.

The first connection portion 531 of one end of the flexible circuit board 500 may be electrically connected to the main circuit board 20 to receive current from the touch driving circuit 40. The second connection portion 532 at the other end of the flexible circuit board 500 may be electrically connected to the third connection portion 533. In this instance, the plurality of conductive lines 521, 522 and 523 may form a current path having a closed-loop structure.

Although not specifically shown in the drawings, for example, the first conductive line 521, the second conductive line 522 and the third conductive line 523 connected to the second connection portion 532 may be electrically connected to the first conductive line 521, the second conductive line 522 and the third conductive line 523 connected to the third connection portion 533, respectively. Accordingly, each of the first conductive line 521, the second conductive line 522 and the third conductive line 523 may form a current path having a closed-loop structure.

As another example, the first conductive line 521 connected to the second connection portion 532 may be electrically connected to the second conductive line 522 connected to the third connection portion 533, the second conductive line 522 connected to the second connection portion 532 may be electrically connected to the third conductive line 523 connected to the third connection portion 533, and the third conductive line 523 connected to the second connection portion 532 may be electrically connected to the first conductive line 521 connected to the third connection portion 533. Accordingly, the first conductive line 521, the second conductive line 522 and the third conductive line 523 may form a single current path having a closed-loop structure.

It is, however, to be understood that embodiments of the disclosure are not limited thereto. The connection structure of the first conductive line 521, the second conductive line 522 and the third conductive line 523 by the second connection portion 532 and the third connection portion 533 may be altered in a variety of ways.

The plurality of conductive lines 521, 522 and 523 may form a closed-loop structure in the main region MR. The width between both sides in the first direction X may be substantially equal to the width between both sides in the second direction Y of the closed-loop structure. According to such a structure, it may be advantageous to make the distribution and/or strength of the magnetic field generated on the inner side of the closed-loop structure (wireless charging area CA) uniform.

Figure 18:
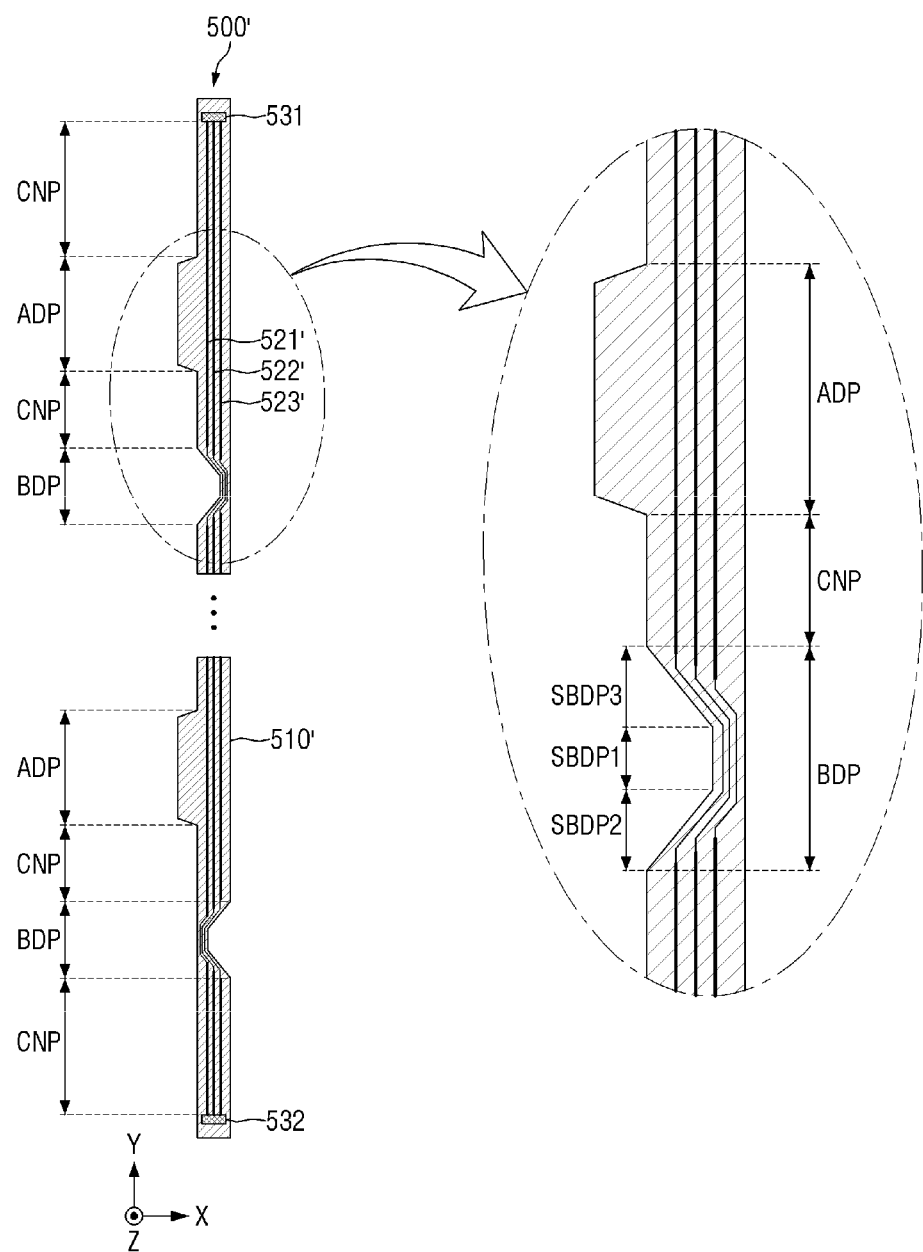
FIG. 18 is a plan view of a flexible circuit board according to yet another embodiment.
Figure 19:
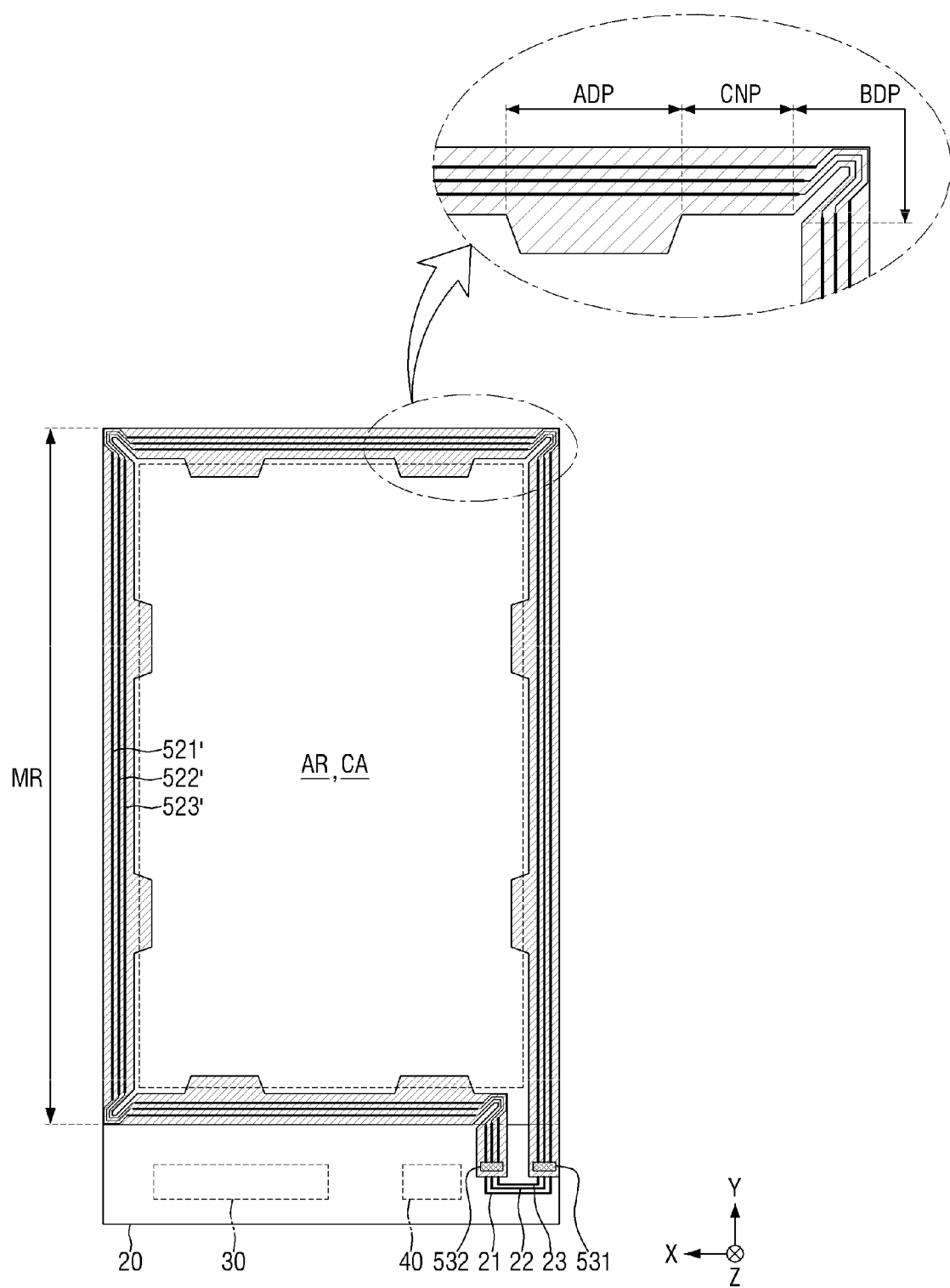
FIG. 19 is a plan view showing an arrangement structure of the flexible circuit board of FIG. 18 when viewed from the rear surface of the display device.

FIG. 18 is a plan view of a flexible circuit board according to yet another embodiment. FIG. 19 is a plan view showing an arrangement structure of the flexible circuit board of FIG. 18 when viewed from the rear surface of the display device.

The embodiment of FIGS. 18 and 19 is different from the embodiment of FIGS. 3 and 7 in that a flexible circuit board 500' includes at least one bending portion BDP, at least one adhesive portion ADP, and a plurality of extension portions CNP. The following description will focus on the difference. In the example shown in FIGS. 18 and 19, the flexible circuit board is bent on the plane formed by the horizontal line (the first direction X) and the vertical line (the second direction Y).

Although the flexible circuit board 500' includes a plurality of bending portions BDP, a plurality of adhesive portions ADP and a plurality of extension portions CNP in the example shown in FIGS. 18 and 19 for convenience of illustration, the flexible circuit board 500 according to another embodiment may include only one of at least one bending portion BDP and at least one adhesive portion ADP.

In the example shown in FIG. 18, the flexible circuit board 500' may include a first side disposed on one side in the first direction X and a second side disposed on the opposite side in the first direction X which extend in the second direction Y. In this instance, the extension portion CNP may be a first section having a first width between the first side and the second side, a first sub-bending portion SBDP1 of the bending portion BDP may be a second section having a second width between the first side and the second side smaller than the first width, and a second sub-bending portion SBDP2 and a third sub-bending portion SBDP3 of the bending portion BDP may be transition sections extending in an oblique direction in which the second side crosses the first side (a direction having an acute or obtuse angle with the second direction Y). The bending portion BDP may occupy 5% or less area of the flexible circuit board.

In addition, the adhesive portion ADP may be a third section having a third width between the first side and the second side greater than the first width.

In the following description, for convenience of illustration, the first section, the second section, the third section, and the transition sections are referred to as the extension portion CNP, the first sub-bending portion SBDP1, the adhesive portion ADP, and the second and third sub-bending portions SBDP2 and SBDP3, respectively.

The plurality of bending portion BDP, the plurality of adhesive portions ADP and the plurality of extension portions CNP may be arranged sequentially and repeatedly between the first connection portion 531 and the second connection portion 532 in the second direction Y. For example, when the flexible circuit board 500 has a rectangular shape in which the width in the second direction Y is greater than the width in the first direction X, the extension portion CNP, the bending portion BDP, the extension portion CNP and the adhesive portion ADP may be arranged in this order repeatedly in the second direction Y. It should be noted that the disclosure is not limited thereto, and the order in which they are arranged may be altered in a variety of ways. For example, they may be arranged repeatedly in the order of the extension portion CNP, the bending portion BDP and the adhesive part ADP, or they may be arranged repeatedly in the order of the extension portion CNP, the adhesive portion ADP and the bending portion BDP.

The width of the base substrate 510' of the extension portion CNP in the first direction X and the extension direction and the width of each of the plurality of conductive lines disposed on the extension portion CNP may be substantially identical to the width of the base substrate 510' in the first direction X and the extension direction and the width of each of the plurality of conductive lines according to the embodiment of FIG. 5.

The base substrate 510' of the bending portion BDP may have a bay shape in which one side in the first direction X is recessed inward, or a bay shape in which the other side in the first direction X is recessed inward. It should be understood, however, that the disclosure is not limited thereto. The base substrate 510' of the bending portion BDP may have a shape in which both sides in the first direction X are recessed inward.

In the example shown in FIG. 18, the base substrate 510 of the bending portion BDP near the second connection portion 532 among the plurality of bending portion BDP has a shape in which the right side in the first direction X is recessed inward, and the base substrate 510 of the other bending portion BDP has a shape in which the left side in the first direction X is recessed inward.

The minimum width of the base substrate 510' of the bending portion BDP in the first direction X may be smaller than the width of the base substrate 510' of the extension portion CNP in the first direction X. For example, the ratio of the minimum width of the base substrate 510' of the bending portion BDP in the first direction X to the width of the base substrate 510' of the extension portion CNP in the first direction X may be, but is not limited to, approximately ⅔ to ¼.

The bending portion BDP may include the first sub-bending portion SBDP1, the second sub-bending part SBDP2, and the third sub-bending portion SBDP3. The first sub-bending portion SBDP1 may have a uniform width of the base substrate 510' in the first direction X. Each of the second sub-bending portion SBDP2 and the third sub-bending portion SBDP3 may be a varying width of the base substrate 510 in the first direction X.

The width of the base substrate 510' of each of the second sub-bending portion SBDP2 and the third sub-bending portion SBDP3 in the first direction X may be greater than the width of the base substrate 510' of the first sub-bending portion SBDP1 in the first direction X and may be smaller than the width of the base substrate 510 of the extension portion CNP in the first direction X.

For example, in the second sub-bending portion SBDP2, the width of the base substrate 510' in the first direction X changes along the second direction Y from the width of the base substrate 510' of the extension portion CNP to the width of the base substrate 510' of the first sub-bending portion SBDP1 in the first direction X. In the third sub-bending portion SBDP3, the width of the base substrate 510' in the first direction X changes along the second direction Y from the width of the base substrate 510 of the first sub-bending portion SBDP1 to the width of the base substrate 510' of the extension portion CNP in the first direction X.

The width of each of the plurality of conductive lines 521', 522' and 523' disposed on the bending portion BDP in the first direction X may be smaller than the width of each of the plurality of conductive lines 521', 522' and 523' disposed on the extension portion CNP in the first direction X. For example, the ratio of the width of each of the plurality of conductive lines 521', 522' and 523' disposed on the bending portion BDP in the first direction X to the width of each of the plurality of conductive lines 521', 522' and 523' disposed on the extension portion CNP in the first direction X may be, but is not limited to, approximately ⅔ to ¼.

In the example shown in FIG. 18, the width of each of the plurality of conductive lines 521', 522' and 523' in the first direction X is smaller in the second sub-bending portion SBDP2 and the third sub-bending portion SBDP3 near the first sub-bending portion SBDP1 than in the extension portion CNP, while the width of each of the plurality of conductive lines 521', 522' and 523' in the first direction X in the second sub-bending portion SBDP2 and the third sub-bending portion SBDP3 near the extension portion CNP is substantially equal to that in the extension portion CNP. For example, the width of each of the plurality of conductive lines 521', 522' and 523' disposed in the second sub-bending portion SBDP2 and the third sub-bending portion SBDP3 in the first direction X may be uniform, and may be smaller than the width of each of the plurality of conductive lines 521', 522' and 523' disposed in the extension portion CNP in the first direction X.

The distance between the plurality of conductive lines 521', 522' and 523' of the bending portion BDP may be smaller than the distance between the plurality of conductive lines 521', 522' and 523' of the extension portion CNP. For example, the ratio of the distance between of the plurality of conductive lines 521', 522' and 523' of the bending portion BDP to the distance between the plurality of conductive lines 521', 522' and 523' of the extension portion CNP may be, but is not limited to, approximately ⅔ to ¼.

Each of the plurality of conductive lines 521', 522' and 523' disposed in the bending portion BDP may extend in a direction parallel to the second direction Y (the direction perpendicular to the first direction X) in the first sub-bending portion SBDP1, and may extend oblique direction with respect to the first direction X in each of the second sub-bending portion SBDP2 and the third sub-bending portion SBDP3. For example, each of the plurality of conductive lines 521', 522' and 523' of the second sub-bending portion SBDP2 may extend in an acute angle direction with respect to the first direction X along the shape of the base substrate 510' of the second sub-bending portion SBDP2.

Each of the plurality of conductive lines 521', 522' and 523' of the third sub-bending portion SBDP3 may extend in an obtuse angle direction with respect to the first direction X along the shape of the base substrate 510' of the third sub-bending portion SBDP3.

As described above, the flexible circuit board 500 according to the embodiment of the disclosure includes the bending portion BDP having a relatively small width of the base substrate 510' in the first direction X and a relatively small width of each of the plurality of conductive lines 521', 522' and 523' in the first direction X, so that the flexibility circuit board 500' can be easily bent or folded on the same plane.

The base substrate 510' of the adhesive portion ADP may have a shape in which one side in the first direction X protrudes outward. The protruding portion of the base substrate 510' of the adhesive portion ADP has a trapezoidal shape when viewed in the first direction X in the example shown in FIGS. 18 and 19, but the disclosure is not limited thereto. It may have a variety of shapes, such as a square, a rectangle, a triangle, a pentagon and other polygons.

The width of the base substrate 510' of the adhesive portion ADP in the first direction X may be greater than the width of the base substrate 510' of the extension portion CNP in the first direction X. For example, the ratio of the width of the base substrate 510' of the adhesive portion ADP in the first direction X to the width of the base substrate 510' of the extension portion CNP in the first direction X may be, but is not limited to, approximately 1.1 to 2.

The thickness, shape and extension direction of each of the plurality of conductive lines 521', 522' and 523' disposed on the adhesive portion ADP may be substantially equal to the thickness, shape and extension direction of each of the plurality of conductive lines 521', 522' and 523' disposed on the extension portion CNP.

When the flexible circuit board 500' includes a plurality of adhesive portion ADP, the area by which the flexible circuit board 500' is attached to the rear surface of the display panel 10 or the rear surface of a support member by the first adhesive member AD1 can be increased. Accordingly, it may be advantageous in bonding the flexible circuit board 500'.

Referring to FIG. 19, the flexible circuit board 500' according to the embodiment of the disclosure may include four bending portions BDP and eight adhesive portions ADP.

The four bending portions BDP may be disposed at the upper corners, the lower left corner and the part near the second connection portion 532 (the part extending from the lower left corner in the first direction X and bent) of the main region MR, respectively, where the flexible circuit board 500' is bent.

Specifically, the bending portion BDP disposed at the upper right corner of the main region MR may be bent from the second direction Y to the first direction X when viewed from the top. The bending portion BDP disposed at the upper left corner of the main region MR may be bent from the first direction X to the direction opposite to the second direction Y when viewed from the top. The bending portion BDP disposed at the lower left corner of the main region MR may be bent from the direction opposite to the second direction Y to the direction opposite to the first direction X when viewed from the top. The bending portion BDP disposed near the second extension portion CNP may be bent from the direction opposite to the first direction X to the direction opposite to the second direction Y.

As such, since the flexible circuit board 500' includes the bending portion BDP, it can be easily bent in right angle direction on the same plane. Accordingly, it may be advantageous in forming a rectangular closed-loop structure when viewed from the top.

In addition, two adhesive portions ADP may be disposed on each of the sides of the rectangular closed-loop structure which protrude toward the inner side. Accordingly, at least a part of each of the plurality of adhesive portions ADP of the flexible circuit board 500 may be disposed in the active area AR. It should be understood, however, that the disclosure is not limited thereto. Each of the plurality of adhesive portions ADP may be disposed in the non-active area NAR.

Although the flexible circuit board 500' includes the four bending portions BDP in the example shown in FIG. 19, the locations where the bending portions BDP are disposed, the number of the bending portions BDP may vary depending on the arrangement structure of the flexible circuit board 500'. For example, when the other end of the flexible circuit board 500' is connected to the part of the flexible circuit board 500' near one end of the flexible circuit board 500' in the main region MR as shown in FIG. 17, the flexible circuit board 500' may include three bending portions BDP.

Although the flexible circuit board 500' includes the eight adhesive parts ADP in the example shown in FIG. 19, it may include four adhesive portions ADP each disposed in each side, respectively. Alternatively, two adhesive portions ADP may be disposed on each of the both sides. The number and arrangement of the adhesive portions ADP are not particularly limited herein. The flexible circuit board 500' may include eight or more adhesive portions ADP.

FIG. 19 shows that the flexible circuit board 500' is bent in the vertical direction on the same plane. However, if the shape of the flexible circuit board 500' has other polygons such as a triangle and a pentagon than a rectangle when viewed from the top, the angle at which the flexible circuit board 500' is bent on the same plane may be larger or smaller than the right angle. Accordingly, the shape of the bending portions BDP may also be deformed.

Figure 20:
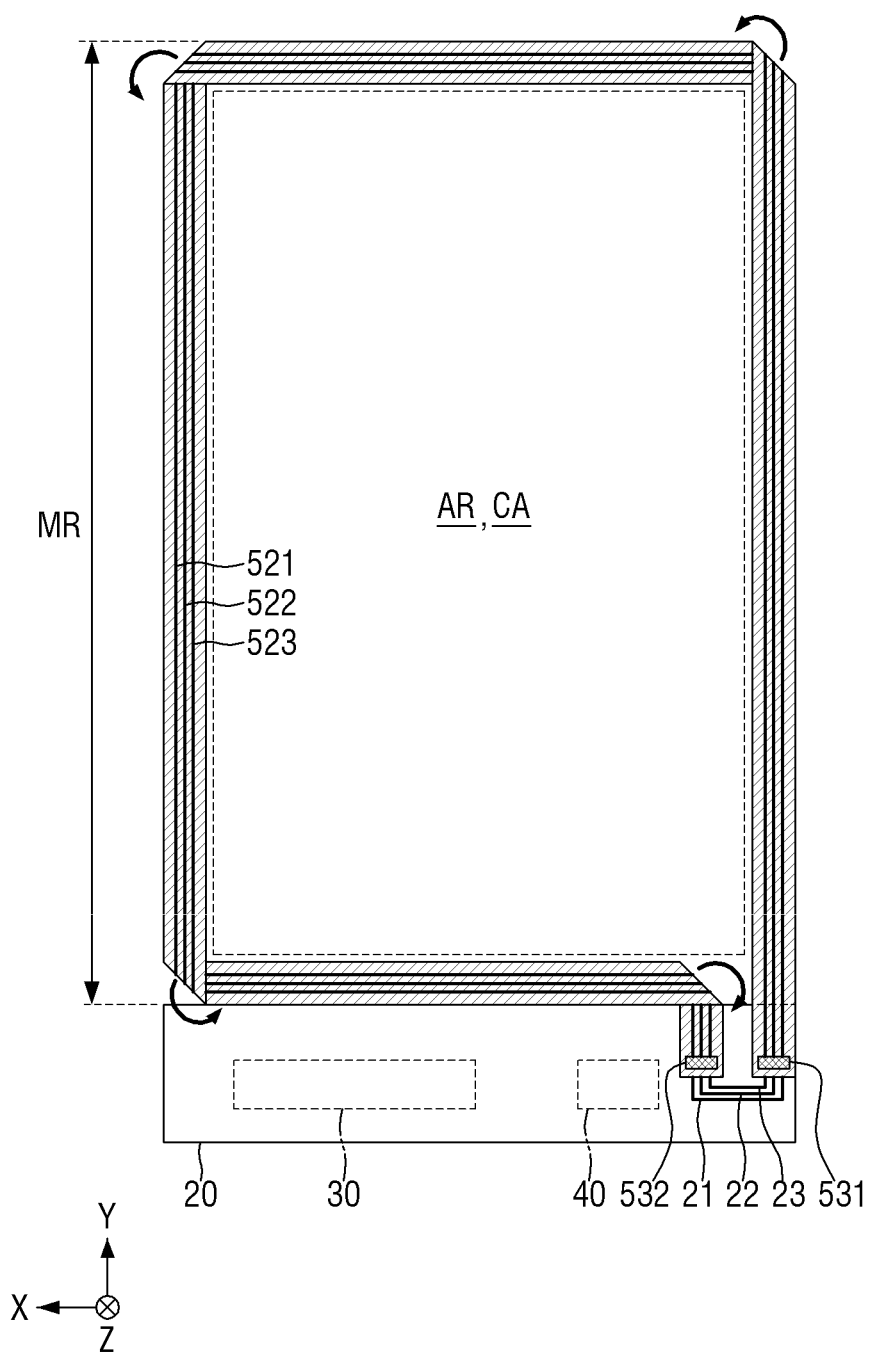
FIG. 20 is a plan view showing an arrangement structure of a flexible circuit board according to yet another embodiment.

FIG. 20 is a plan view showing an arrangement structure of a flexible circuit board according to yet another embodiment.

The embodiment of FIG. 20 is different from the embodiment of FIG. 3 in that a flexible circuit board 500 is disposed in a rectangular shape in the main region MR, and the flexible circuit board 500 is folded at the corners in the thickness direction (third direction Z) and the vertical direction on a plane. The following description will focus on the difference.

Referring to FIG. 20, the flexible circuit board 500 may be folded to have a right angle at the upper corners, the lower left corner and the part near the second connection portion 532 (the part extended from the lower left corner in the first direction X and bent).

As the flexible circuit board 500 is folded, the surfaces of the flexible circuit board 500 adjacent to each other may face opposite directions.

For example, the flexible circuit board 500 may be folded at the upper right corner of the main region MR along the first direction X, may be folded at the upper left corner along the direction opposite to the second direction Y, may be folded at the lower left corner along the direction opposite to the first direction X, and may be folded near the second connection portion 532 along the direction opposite to the second direction Y when viewed from the top.

Accordingly, when viewed from the top, the surface of the flexible circuit board 500 facing the rear surface of the display device 1 may be revered so that it faces the front side of the display device 1 at the upper right corner of the main region MR, may be revered so that it faces the rear side of the display device 1 at the upper left of the main region MR, may be reversed so that it faces the front side of the display device 1 at the lower left corner, and may be reversed so that it faces the rear side of the display device 1 near the second connection portion 532.

That is to say, the number of times that the surface of the flexible circuit board 500 is reversed may be substantially equal to the number of times that the flexible circuit board 500 is folded. In FIG. 20, the surface of the flexible circuit board 500 is reversed four times as the flexible circuit board 500 is folded four times, but the disclosure is not limited thereto. For example, when the other end of the flexible circuit board 500 is connected to the part of the flexible circuit board 500 near one end of the flexible circuit board 500 in the main region MR as shown in FIG. 17, the surface of the flexible circuit board 500 may be reversed three times.

In addition, the opposite surface of the flexible circuit board 500 may be folded so that a part of the opposite surface faces the other part of the opposite surface where the flexible circuit board 500 is folded, and a part of the flexible circuit board 500 may overlap another part in a right-angled and the overlapped portion may have a light-triangled triangle shape.

In such case, each of the plurality of conductive lines 521, 522 and 523 may overlap each other in the third direction Z in the overlapped portion. It should be noted that each of the conductive lines 521, 522 and 523 is surrounded by the base substrate 510 and the cover layer 540, and thus the loop structure of each of the conductive lines 521, 522 and 523 can be maintained.

An adhesive may be applied between the parts of the opposite surface of the flexible circuit board 500 facing each other to fix the arrangement structure of the flexible circuit board 500, but the disclosure is not limited thereto. For example, the flexible circuit board 500 may be fixed by being adhered to another layer, a substrate, a sheet, etc. through a separate adhesive layer while the flexible circuit board 500 is folded.

FIG. 20 shows that the flexible circuit board 500 is folded to have a right angle. However, if the shape of the flexible circuit board 500 has other polygons such as a triangle and a pentagon than a rectangle when viewed from the top, the angle at which the flexible circuit board 500 is folded on the same plane may be larger or smaller than the right angle.

According to such a structure, the plurality of conductive lines 521, 522 and 523 of the flexible circuit board 500 has a uniform line width, and the direction of the current can be constant in the plurality of conductive lines 521, 522 and 523 or in the closed-loop structure formed by the plurality of conductive lines 521, 522 and 523 and the plurality of connection lines 21, 22 and 23. Accordingly, it may be advantageous in making the distribution and intensity of the magnetic field generated by the flexible circuit board 500 to in controlling them.

Figure 21:
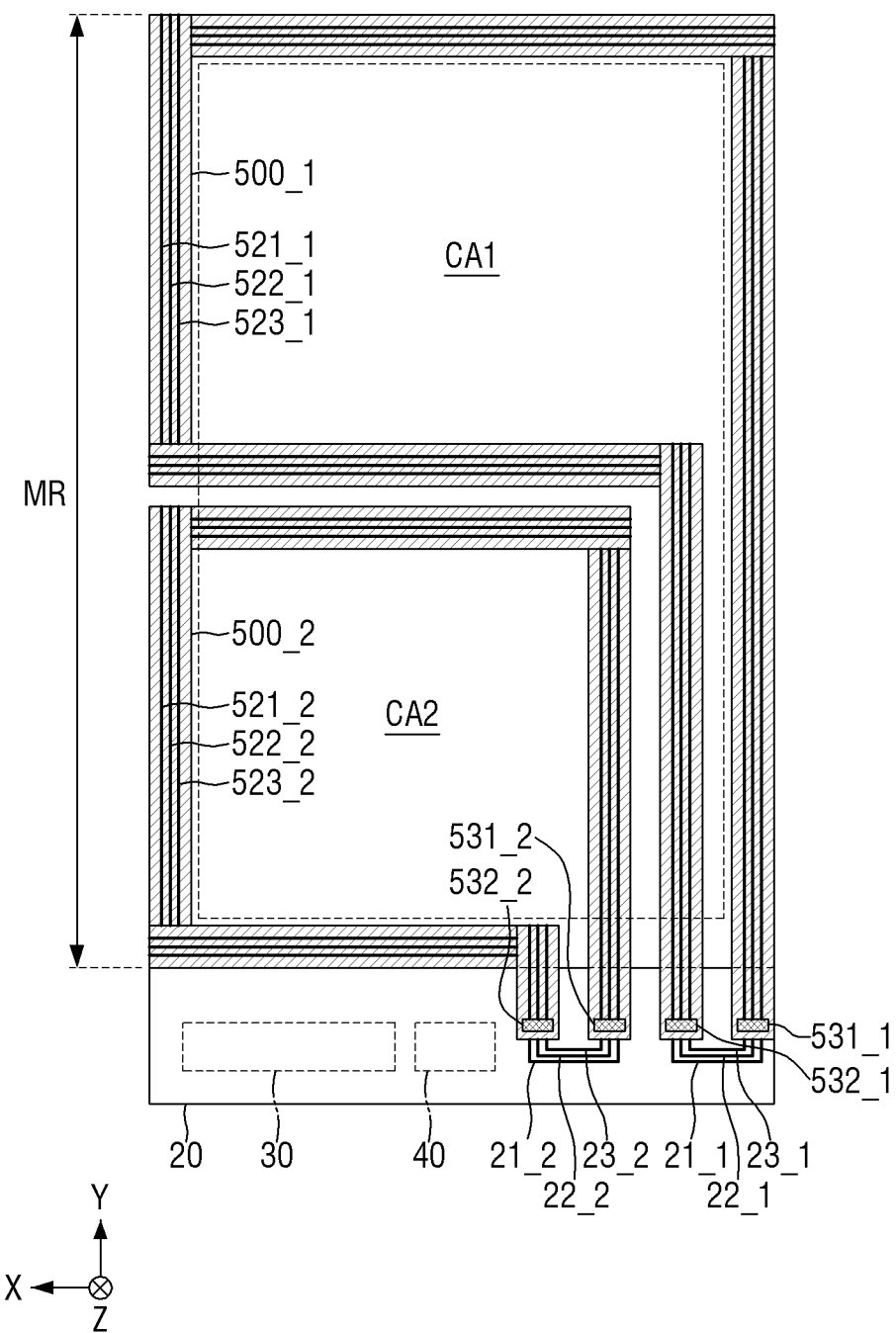
FIG. 21 is a plan view showing an arrangement structure of a flexible circuit board according to yet another embodiment.

FIG. 21 is a plan view showing an arrangement structure of a flexible circuit board according to yet another embodiment.

The embodiment of FIG. 21 is different from the embodiment of FIG. 3 in that a display device 1 includes a plurality of flexible circuit boards 500. The following description will focus on the difference.

Referring to FIG. 21, the display device 1 may include a first flexible circuit board 500_1 and a second flexible circuit board 500_2. The first flexible circuit board 500_1 and the second flexible circuit board 500_2 may be electrically connected to a plurality of connection lines 21_1, 22_1 and

23_1, and 21_2, 22_2 and 23_2 of the main circuit board 20, respectively, to have closed-loop structures.

For example, the first flexible circuit board 500_1 may have a loop structure surrounding the upper area of the active area AR in the main region MR, and the second flexible circuit board 500_2 may have a loop structure surrounding the lower area of the active area AR in the main region MR. Each of the first flexible circuit board 500_1 and the second flexible circuit board 500_2 may have a loop shape surrounding at least one-quarter of the active area AR.

Specifically, the first flexible circuit board 500_1 may be disposed in the non-active area NAR on the right side, the upper side, and a part of the left side of the main area MR, and the second flexible circuit board 500_2 may be disposed in the non-active area NAR on the other part of the left side and the lower side of the main region MR to surround the active area AR. In addition, each of the first flexible circuit board 500_1 and the second flexible circuit board 500_2 may traverse the central area of the active area AR in the first direction X.

A plurality of conductive lines 521_1, 522_1 and 523_1 of the first flexible circuit board 500_1 may form current paths with a plurality of connection lines 21_1, 22_1 and 23_1 of the main circuit board 20, respectively. A plurality of conductive lines 521_2, 522_2 and 523_2 of the second flexible circuit board 500_2 may form current paths with the plurality of connection lines 21_2, 22_2 and 23_2 of the main circuit board 20, respectively. It is, however, to be understood that the disclosure is not limited thereto.

For example, the plurality of conductive lines 521_1, 522_1 and 523_1 of the first flexible circuit board 500_1 may form a single current path by the plurality of connection lines 21_1, 22_1 and 23_1 of the main circuit board 20. The plurality of conductive lines 521_2, 522_2 and 523_2 of the second flexible circuit board 500_2 may form a single current path by the plurality of connection lines 21_2, 22_2 and 23_2 of the main circuit board 20. As another example, the plurality of conductive lines 521_1, 522_1 and 523_1 of the first flexible circuit board 500_1 and the plurality of conductive lines 521_2, 522_2, and 523_2 of the second flexible circuit board 500_2 may be electrically connected with one another by the plurality of connection lines 21_1, 22_1, 23_1, 21_2, 22_2 and 23_2 of the main circuit board 20.

Each of the first flexible circuit board 500_1 and the second flexible circuit board 500_2 may have a loop structure in the main region MR. Accordingly, the display device 1 may include a first wireless charging area CA1 defined as an inner area of the loop structure by the first flexible circuit board 500_1, and a second wireless charging area CA2 defined as an inner area of the loop structure by the second flexible circuit board 500_2.

The area of each of the first wireless charging area CA1 and the second wireless charging area CA2 may be smaller than the area of the wireless charging area CA by the single flexible circuit board 500 surrounding the active area AR. Accordingly, the strength of the magnetic field generated by constructive interference in each of the first wireless charging area CA1 and the second wireless charging area CA2 may be greater than the strength of the magnetic field generated by constructive interference in the wireless charging area CA by the single flexible circuit board 500 surrounding the active area AR.

In addition, in a space between the first wireless charging area CA1 and the second wireless charging area CA2 in the main area MR, for example, in the space between the side of the first flexible circuit board 500_1 crossing the active area AR in the first direction X and the side of the second flexible circuit board 500_2 crossing the active area AR in the first direction X, the magnetic fields generated by the first flexible circuit board 500_1 and the second flexible circuit board 500_2 may constructively interfere. The direction of the magnetic field in the space between the first wireless charging area CA1 and the second wireless charging area CA2 may be opposite to the directions of the magnetic fields generated in the first wireless charging area CA1 and the second wireless charging area CA2. It should be noted that the direction of the magnetic field for providing the wireless charging function may be required to be in the vertical direction (third direction Z or the direction opposite to the third direction Z) in some implementations. Accordingly, it is possible to provide the wireless charging function even in the space between the first wireless charging area CA1 and the second wireless charging area CA2.

According to such a structure, by increasing the strength of the magnetic field in particular areas, i.e., in the first wireless charging area CA1 and the second wireless charging area CA2, it may be advantageous to reduce the time required to charge the electronic pen.

The embodiment of FIG. 21 is an example of the arrangement structure of the plurality of flexible circuit boards 500_1 and 500_2 when the display device 1 includes the plurality of flexible circuit boards 500_1 and 500_2. According to another embodiment, the display device 1 may include three or more flexible circuit boards 500, and accordingly, the arrangement structure of each of the plurality of flexible circuit boards 500 may be variously modified.

Figure 22:
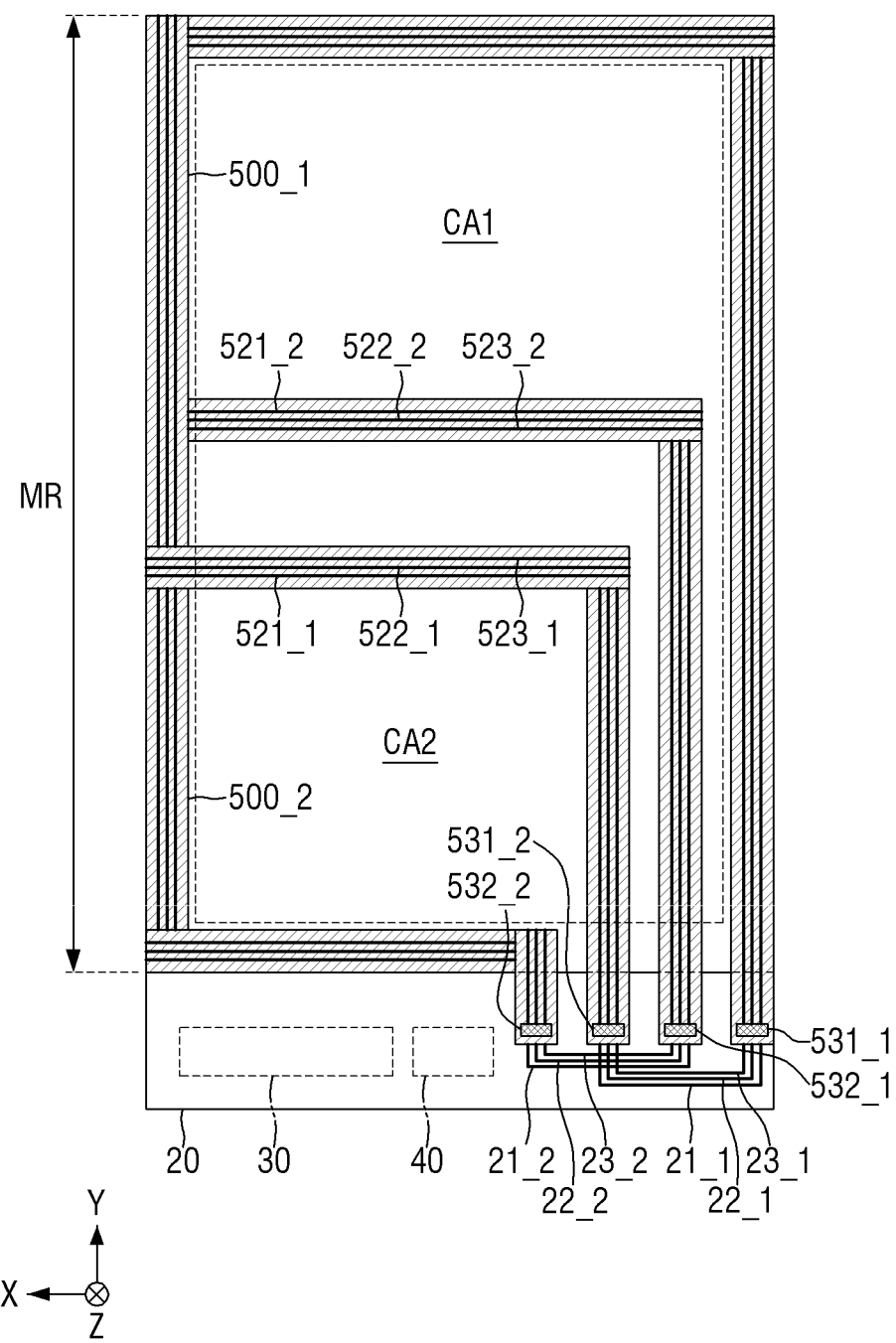
FIG. 22 is a plan view showing an arrangement structure of a flexible circuit board according to yet another embodiment.

FIG. 22 is a plan view showing an arrangement structure of a flexible circuit board according to yet another embodiment.

The embodiment of FIG. 22 is different from the embodiment of FIG. 21 in that a first flexible circuit board 500_1 and a second flexible circuit board 500_2 are arranged such that they cross each other at least partially around the center of the main region MR.

The first wireless charging area CA1 which is the inner area of the closed-loop structure of the first flexible circuit board 500_1 and the second wireless charging area CA2 which is the inner area of the closed-loop structure of the second flexible circuit board 500_2 may overlap each other at the center of the main region MR in a plan view.

In this instance, the magnetic field of the area where the first wireless charging area CA1 and the second wireless charging area CA2 do not overlap may have a relatively small strength because there are components that destructively interfere with each other. However, the magnetic fields in the area where the first wireless charging area CA1 and the second wireless charging area CA2 overlap each other constructively interfere with each other, and thus the strength of the magnetic fields can be relatively large.

Accordingly, according to such a structure, it may be advantageous to reduce the time required to charge the electronic pen by relatively increasing the strength of the magnetic field in the center of the main region MR.

Figure 23:
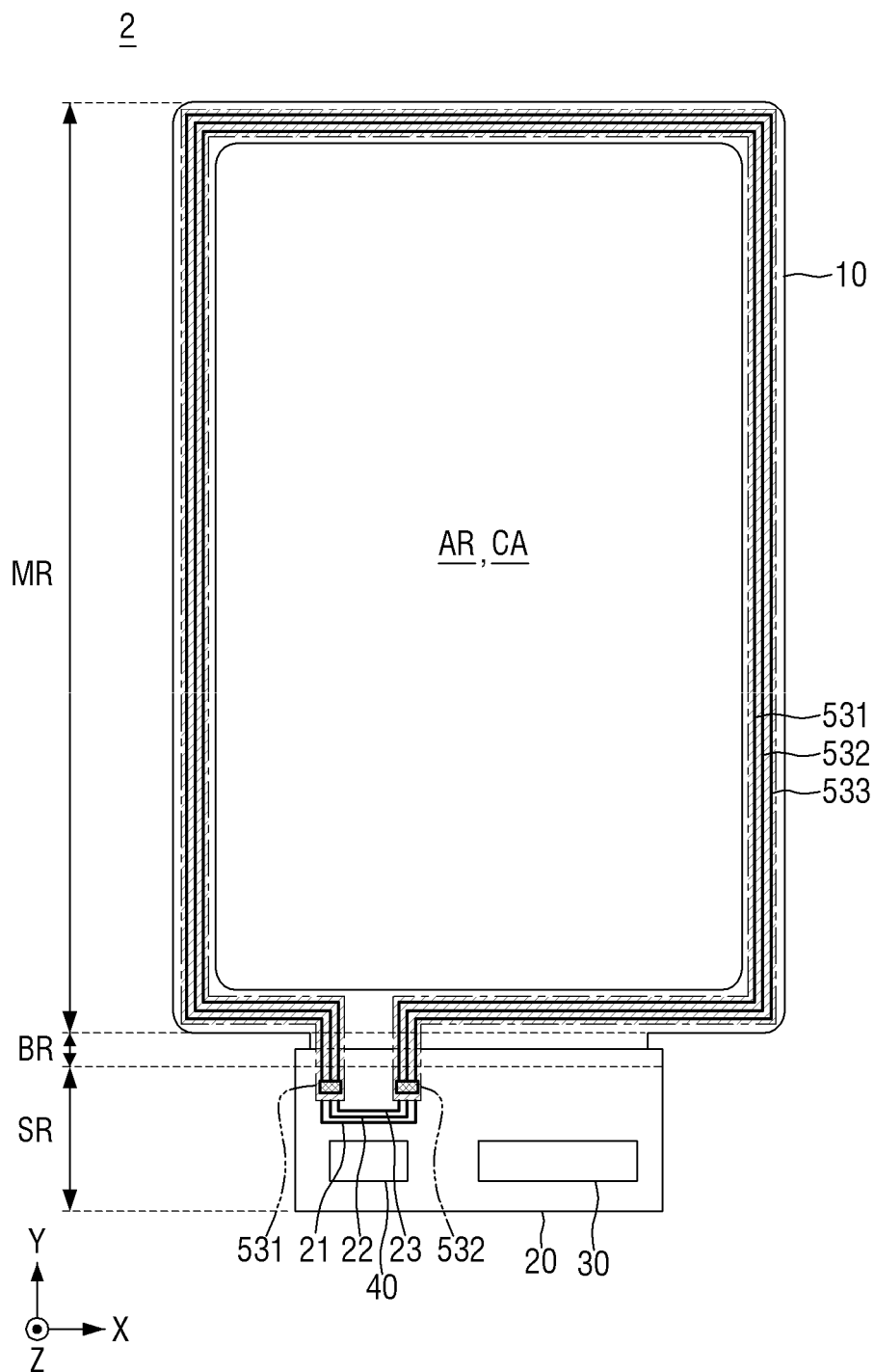
FIG. 23 is a plan view showing the layout of a display device according to another embodiment of the disclosure.
Figure 24:
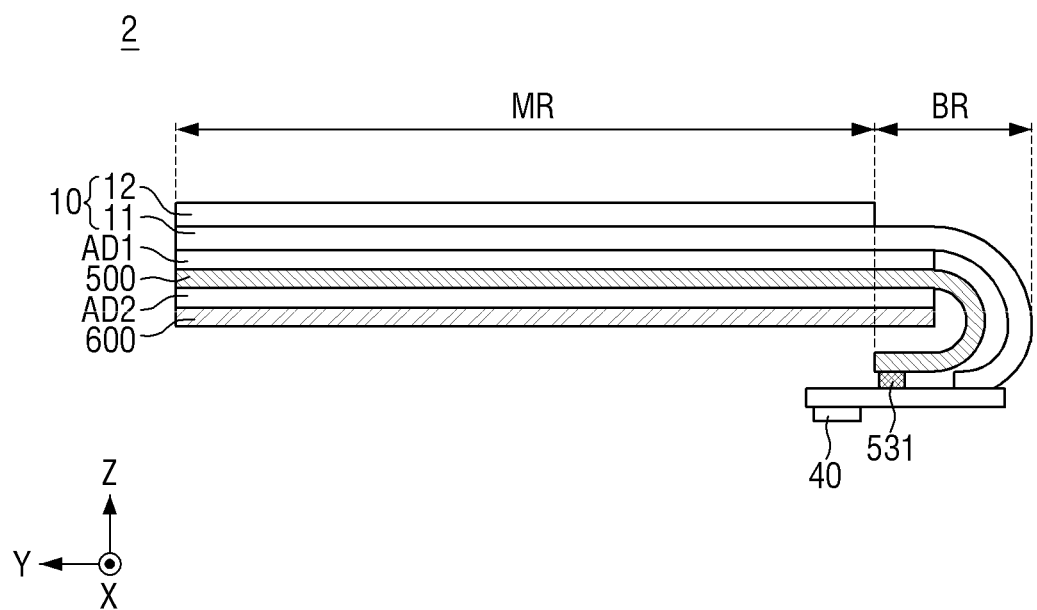
FIG. 24 is a cross-sectional view of a display device according to another embodiment of the disclosure when viewed in the first direction.

FIG. 23 is a plan view showing the layout of a display device according to another embodiment of the disclosure. FIG. 24 is a cross-sectional view of a display device according to another embodiment of the disclosure when viewed in the first direction.

The embodiment of FIGS. 23 and 24 is different from the embodiment of FIGS. 2 and 5 in that a display device 2 has rounded corners when viewed from the top, that a sub-region SR of a display panel 10 is bent in the thickness direction, and that a flexible circuit board 500 is bent six times when viewed from the top. The following description will focus on the differences.

The display panel 10 may include a main region MR and a bending region BR. The main region MR may have a shape similar to the outer shape of the display device 2 when viewed from the top. The main region MR may be a flat region located in one plane. It is, however, to be understood that the disclosure is not limited thereto. At least one of the edges of the main region MR except for the edge (side) connected to the bending region BR may be bent to form a curved surface.

The bending region BR is connected to one side of the main region MR in the second direction DR2. For example, the bending region BR may be connected to the lower shorter side of the main region MR. The width of the bending region BR may be less than the width (width of the shorter side) of the main region MR.

The display panel 10 may include a flexible substrate including a flexible polymer material such as polyimide. Accordingly, the display panel 10 may be curved, bent, folded, or rolled.

In the bending region BR, at least a part of the display panel 10 may be bent downward in the thickness direction DR3, i.e., in the direction away from the display surface with a curvature. Although the display panel 10 may have a constant radius of curvature in the bent region BR, the disclosure is not limited thereto. It may have different radius of curvature for different sections.

As the display panel 10 is bent at the bending region BR, the surface of the display panel 10 may be reversed. Specifically, the surface of the display panel 10 facing in the third direction Z may be bent so that it faces the outside and then faces in the direction opposite to the third direction Z.

The main circuit board 20 may be disposed at the lower end of the bending region BR of the display panel 10. The width of the main circuit board 20 in the first direction X may be greater than the width of the bending region BR in the first direction X. It should be understood, however, that the disclosure is not limited thereto. The width of the main circuit board 20 in the first direction X may be substantially equal to or smaller than the width of the bending region BR in the first direction X.

The flexible circuit board 500 may be bent at the upper corners and the lower corners of the main region MR, and may be arranged to have a loop shape surrounding at least a part of the active area AR.

In addition, the flexible circuit board 500 may be bent from the main region MR to the bending region BR. In other words, the flexible circuit board 500 may be bent to cross the boundary between the main region MR and the bending region BR. For example, the part of the flexible circuit board 500 bent at the lower left corner of the main region MR may extend in the first direction X and then bent in the direction opposite to the second direction Y. The part of the flexible printed circuit board 500 bent at the lower right corner of the main region MR may extend in the direction opposite to the first direction X and then bent in the direction opposite to the second direction Y.

The flexible circuit board 500 bent to cross the boundary between the main region MR and the bending region BR may overlap the main circuit board 20 in the third direction Z. Accordingly, the plurality of conductive lines 521, 522 and 523 of the flexible circuit board 500 may be electrically connected to the plurality of connection lines 21, 22 and 23 through a first connection portion 531 and a second connection portion 532, respectively.

The flexible circuit board 500 may be bent with a curvature in the direction opposite to the third direction Z (toward the lower side in the thickness direction) in the bending region BR. As the flexible circuit board 500 is bent, the surface of the flexible circuit board 500 may be reversed. That is to say, the surface of the flexible circuit board 500 facing in the third direction Z may be bent so that it faces the outside and then faces in the opposite direction to the third direction Z.

Although the flexible circuit board 500 is bent to have a right angle at the corners of the main region MR in a plan view in the example shown in FIG. 23, the disclosure is not limited thereto. The flexible circuit board 500 may be bent at the corners of the main region MR at an acute angle or an obtuse angle on the plane, or may be bent several times.

As described above, in forming the plurality of conductive lines 521, 522 and 523 for generating magnetic field, the flexible circuit board 500 is folded or bent to surround the active area AR, so that it may be advantageous in realizing a large wireless charging area CA while reducing unnecessary costs, and in reducing the weight of the display device 2.

In addition, since the base substrate 510 is not disposed in the area surrounded by the flexible circuit board 500, it may be advantageous in preventing that the direction of the magnetic field generated by the plurality of conductive lines 521, 522 and 523 is changed or that the strength of the magnetic field is reduced.

As another example, in the area surrounded by the flexible circuit board 500, other layers, sheets, etc. may be disposed so that they do not overlap the flexible circuit board 500 in the thickness direction. According to such a structure, it may be advantageous to increase the space utilization of the display device 2 and reduce the overall thickness of the display device 2.

Features of various embodiments of the disclosure may be combined partially or totally. As will be clearly appreciated by those skilled in the art, technically various interactions and operations are possible. Various embodiments can be practiced individually or in combination.

In concluding the detailed description, those skilled in the art will appreciate that many variations and modifications can be made to the preferred embodiments without substantially departing from the principles of the present inventive concept. Therefore, the disclosed preferred embodiments of the inventive concept are used in a generic and descriptive sense only and not for purposes of limitation.

What is claimed is:

1. A display device comprising:
   a display panel comprising an active area for displaying images on a front surface and a non-active area around the active area; and
   a flexible circuit board comprising at least one conductive line extending from one end to an opposite end,
   wherein the flexible circuit board is disposed on a rear surface of the display panel to surround more than half of at least a part of the active area to have an opening exposing the active area in a plan view.

2. The display device of claim 1, further comprising:
   a main circuit board disposed in the non-active area of the display panel,
   wherein the one end and the opposite end of the flexible circuit board are disposed on the main circuit board such that they are spaced apart from each other.

3. The display device of claim 2, wherein the main circuit board comprises at least one connection line, and wherein the at least one conductive line of the flexible circuit board is electrically connected to the at least one connection line of the main circuit board.

4. The display device of claim 3, wherein the at least one conductive line comprises a plurality of conductive lines and the at least one connection line comprises a plurality of connection lines, and
wherein a single current path is formed by the plurality of conductive lines and the plurality of connection lines.

5. The display device of claim 1, wherein the flexible circuit board overlaps the non-active area.

6. The display device of claim 5, wherein the flexible circuit board does not overlap the active area.

7. The display device of claim 1, further comprising:
a main circuit board disposed in the non-active area of the display panel,
wherein the flexible circuit board comprises a first section closer to the one end and a second section closer to the opposite end, and the one end of the flexible circuit board is disposed on the main circuit board, and the opposite end of the flexible circuit board is connected to the second section of the flexible circuit board.

8. The display device of claim 7, wherein the flexible circuit board completely surrounds at least a part of the active area.

9. The display device of claim 1, wherein the flexible circuit board comprises a first area extending in a first direction, a second area extending in a second direction crossing the first direction, and a first corner area located between the first area and the second area to connect them, and
wherein at least two surfaces of the flexible circuit board overlap each other in the first corner area.

10. The display device of claim 9, wherein the flexible circuit board is bent so that at least a part of one surface of the flexible circuit board faces another part of the one surface of the flexible circuit board in the first corner area.

11. The display device of claim 9, wherein the flexible circuit board comprises:
a third area extending in a direction opposite to the first direction,
a second corner area disposed between the second area and the third area to connect the second area and the third area,
a fourth area extending in a direction opposite to the second direction,
a third corner area disposed between the third area and the fourth area to connect the third area and the fourth area,
a fifth area extending in the direction opposite to the first direction, and
a fourth corner area disposed between the fourth area and the fifth area to connect the fourth area and the fifth area,
wherein a width of each of the first area, the third area and the fifth area of the flexible circuit board in the second direction is equal to a width of each of the second area and the fourth area in the first direction, and
wherein the flexible circuit board has a loop shape surrounding at least ¾ of the active area.

12. The display device of claim 1, wherein the flexible circuit board comprises a first subsidiary flexible circuit board and a second subsidiary flexible circuit board, and
wherein each of the first subsidiary flexible circuit board and the second subsidiary flexible circuit board has a loop shape surrounding at least one-fourth of the active area.

13. The display device of claim 12, wherein the first subsidiary flexible circuit board and the second subsidiary flexible circuit board do not overlap each other in a plan view.

14. The display device of claim 12, wherein the first subsidiary flexible circuit board and the second subsidiary flexible circuit board partially overlap each other in a plan view.

* * * * *